(12) United States Patent
Fujisawa et al.

(10) Patent No.: US 6,376,139 B1
(45) Date of Patent: Apr. 23, 2002

(54) CONTROL METHOD FOR EXPOSURE APPARATUS AND CONTROL METHOD FOR SEMICONDUCTOR MANUFACTURING APPARATUS

(75) Inventors: Tadahito Fujisawa, Tokyo; Soichi Inoue, Yokohama; Kenji Kawano, Yokohama; Shinichi Ito, Yokohama; Ichiro Mori, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 5 days.

(21) Appl. No.: 09/671,502

(22) Filed: Sep. 27, 2000

(30) Foreign Application Priority Data

Sep. 28, 1999 (JP) ............................................ 11-274702

(51) Int. Cl.$^7$ .............................. G03F 9/00; G03C 5/00
(52) U.S. Cl. .......................................... 430/30; 430/311
(58) Field of Search ................................... 430/30, 311

(56) References Cited

U.S. PATENT DOCUMENTS 5,508,803 A    4/1996    Hibbs et al. ................. 356/243

FOREIGN PATENT DOCUMENTS

| JP | 8-45804 | 2/1996 |
| JP | 9-92606 | 4/1997 |
| JP | 9-329889 | 12/1997 |
| JP | 10-256114 | * 9/1998 |
| JP | 10-275755 | 10/1998 |
| JP | 11-307431 | * 11/1999 |

OTHER PUBLICATIONS

Starikov; "Exposure Monitor Structure", SPIE, vol. 1261, Integrated Circuit Metrology, Inspection, and Process Control IV, pp. 315–324, (1990).

Vankessel et al.; "Use of Scatterometric Latent Image Detector in Closed Loop Feedback Control of Linewidth", SPIE, vol. 2196, pp. 352–359, (1994).

Wheeler et al.; "Phase Shift Focus Monitor Applications to Lithography Tool Control", SPIE, vol. 3051, pp. 225–233, (1997).

* cited by examiner

Primary Examiner—Christopher G. Young
(74) Attorney, Agent, or Firm—Finnegan, Henderson, Farabow, Garrett & Dunner, L.L.P.

(57) ABSTRACT

A control method for an exposure apparatus, in which an exposure amount and a focus value are set in transferring a circuit pattern on a mask onto a resist formed on a wafer by the exposure apparatus, includes the steps of arranging, on the mask, an exposure amount monitor mark and a focus monitor mark used to separately monitor the effective exposure amount and the focus value on the wafer, transferring the exposure amount monitor mark and the focus monitor mark onto the resist to form an exposure amount monitor pattern and a focus monitor pattern, measuring the states of the exposure amount monitor pattern and the focus monitor pattern at least at one of timings after exposure, after post exposure baking, during a cooling process after baking, during a process after cooling, during development, and after development, on the basis of the measurement results, calculating the difference between an optimum exposure amount value and an exposure amount set value set in the exposure apparatus and the difference between an optimum focus value and a focus set value set in the exposure apparatus in transferring the exposure amount monitor mark and the focus monitor mark onto the resist, and changing the focus set value and the exposure amount set value of the exposure apparatus in accordance with the calculated differences.

4 Claims, 18 Drawing Sheets

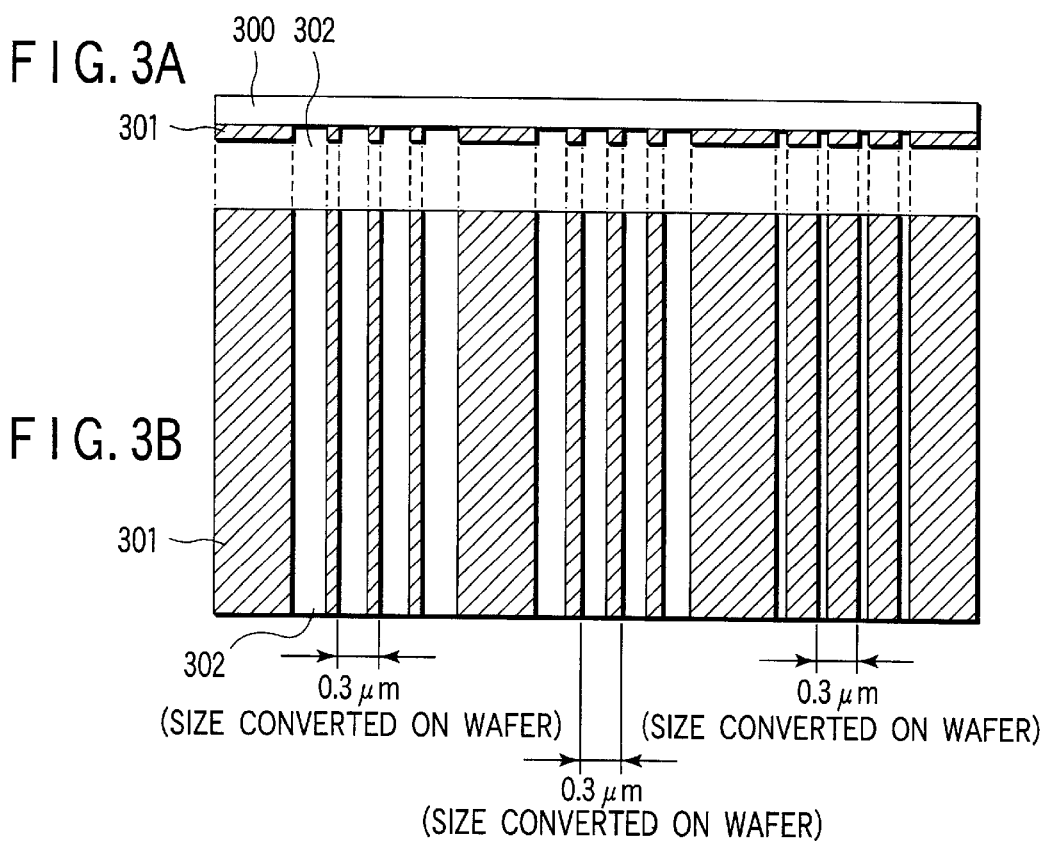
FIG. 3A
FIG. 3B
0.3 μm (SIZE CONVERTED ON WAFER)
0.3 μm (SIZE CONVERTED ON WAFER)
0.3 μm (SIZE CONVERTED ON WAFER)
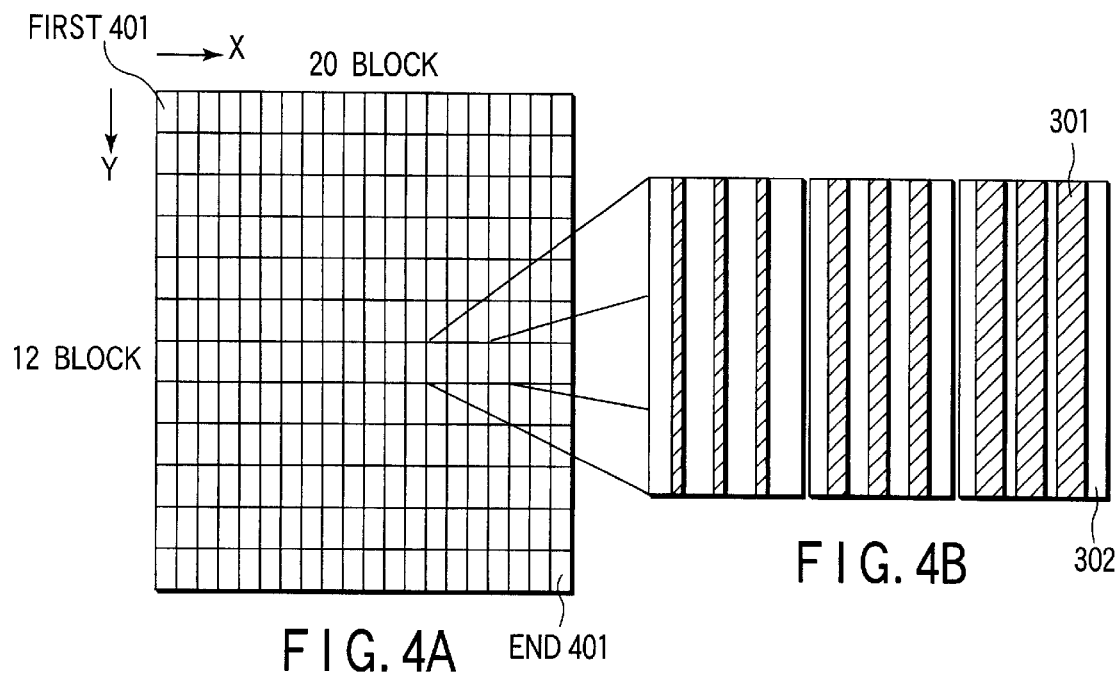
FIG. 4A
FIG. 4B

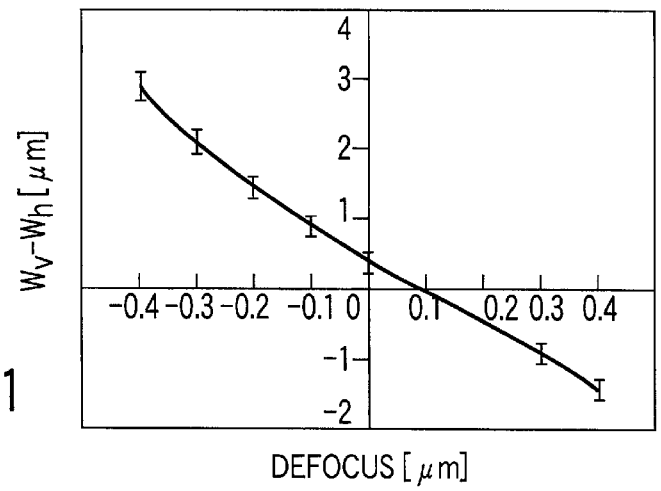
FIG. 11
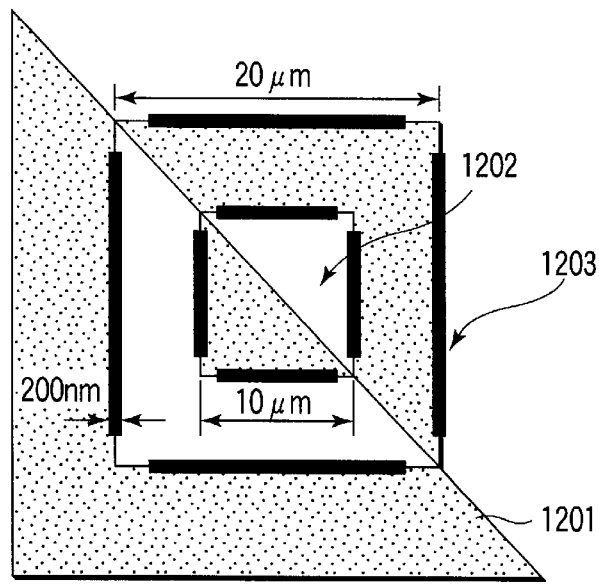
FIG. 12
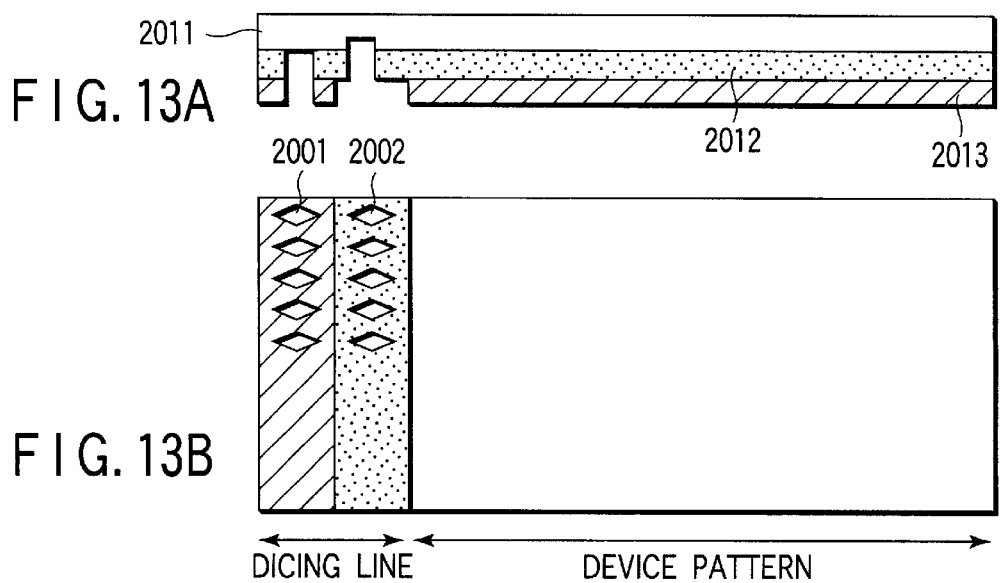
FIG. 13A
FIG. 13B

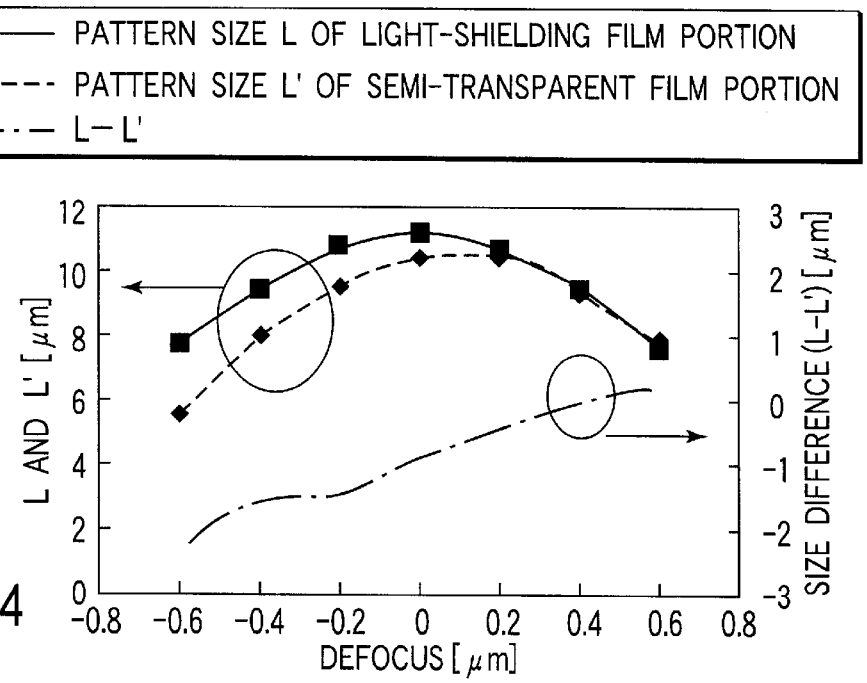
F I G. 14
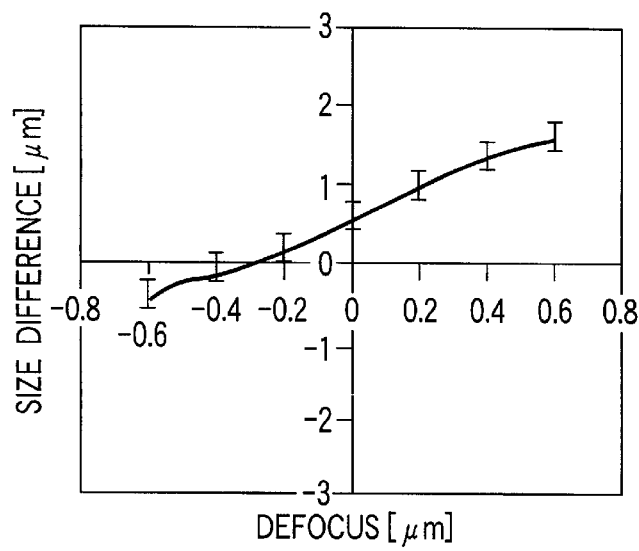
F I G. 15
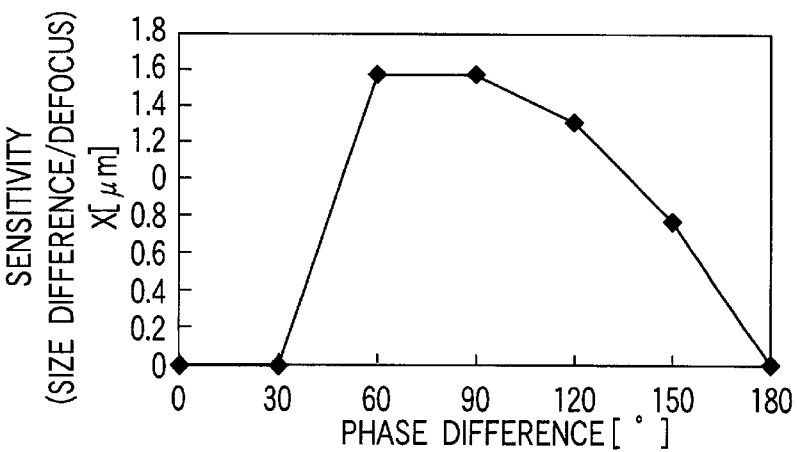
F I G. 16

FIG. 17A
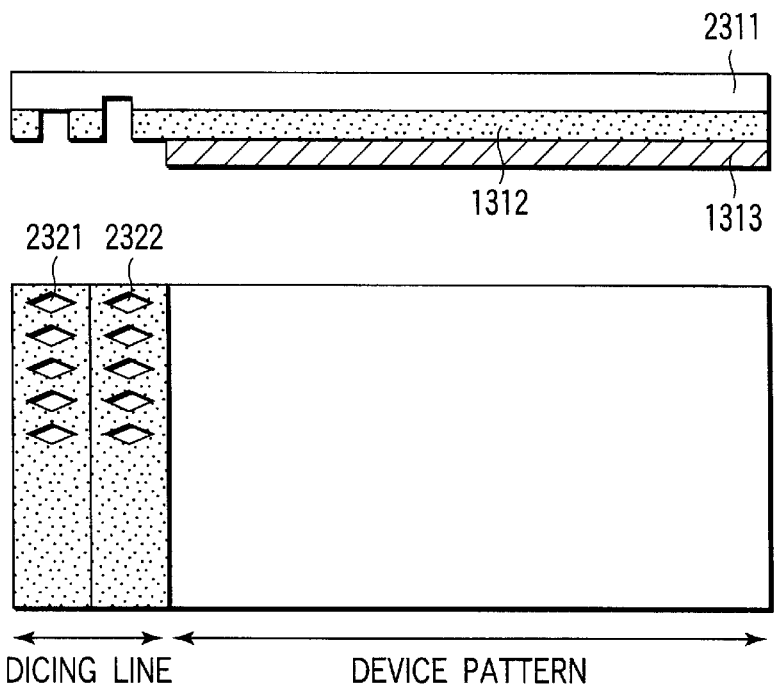
FIG. 17B
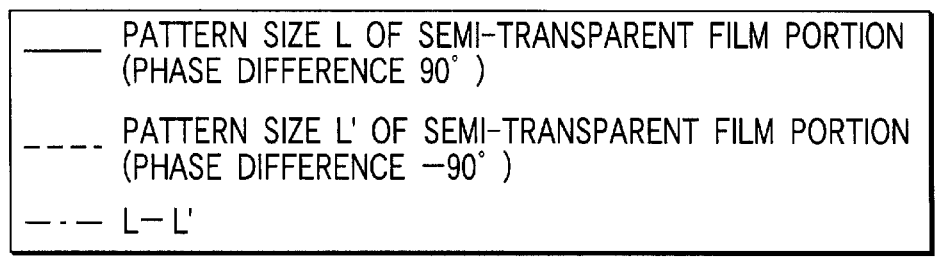
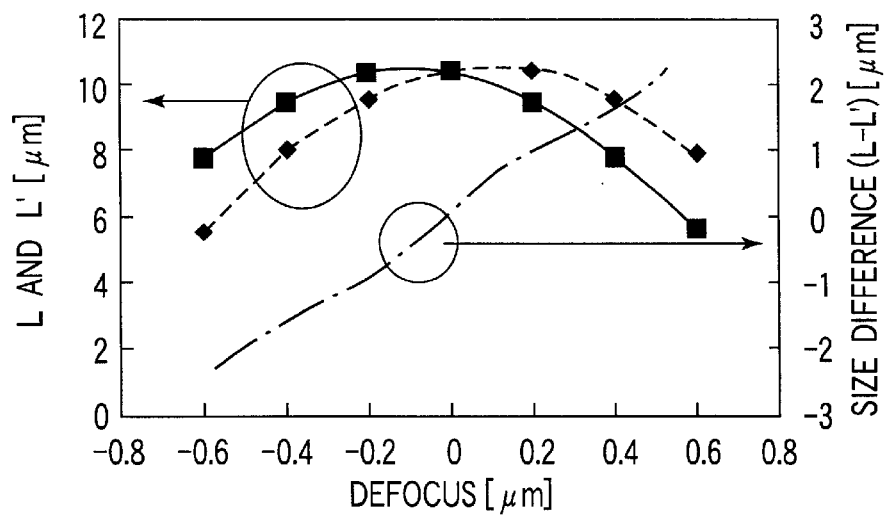
FIG. 18

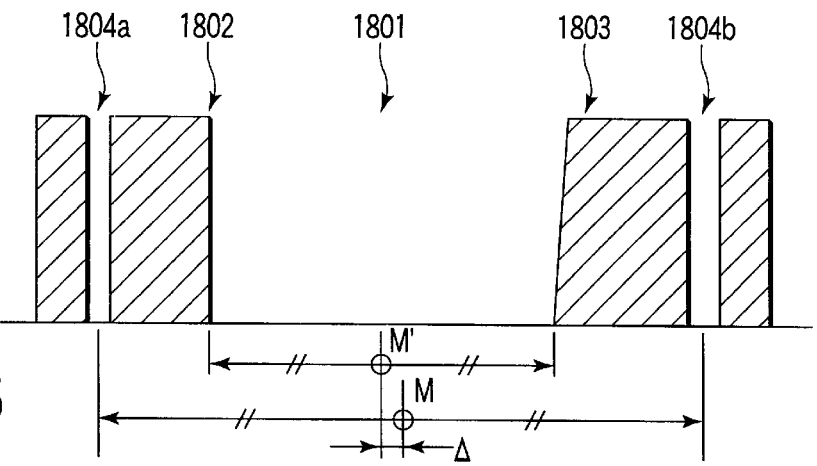
FIG. 25
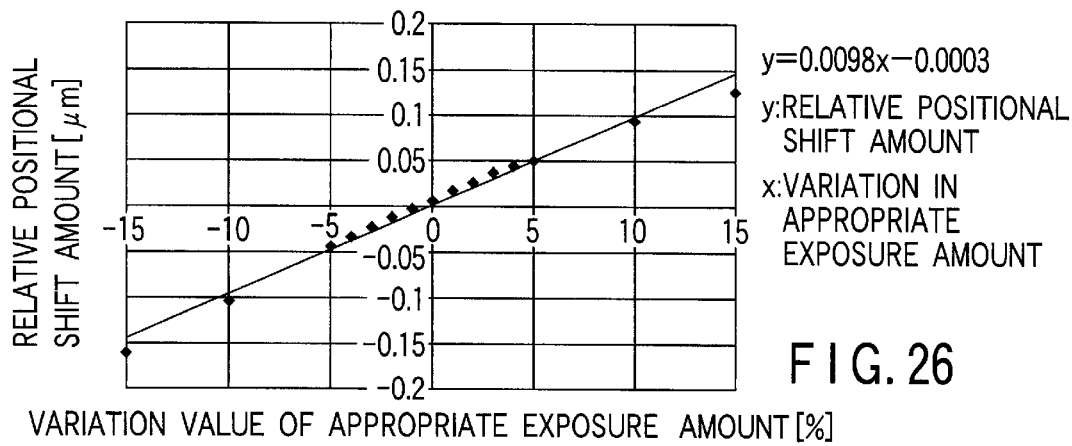
FIG. 26
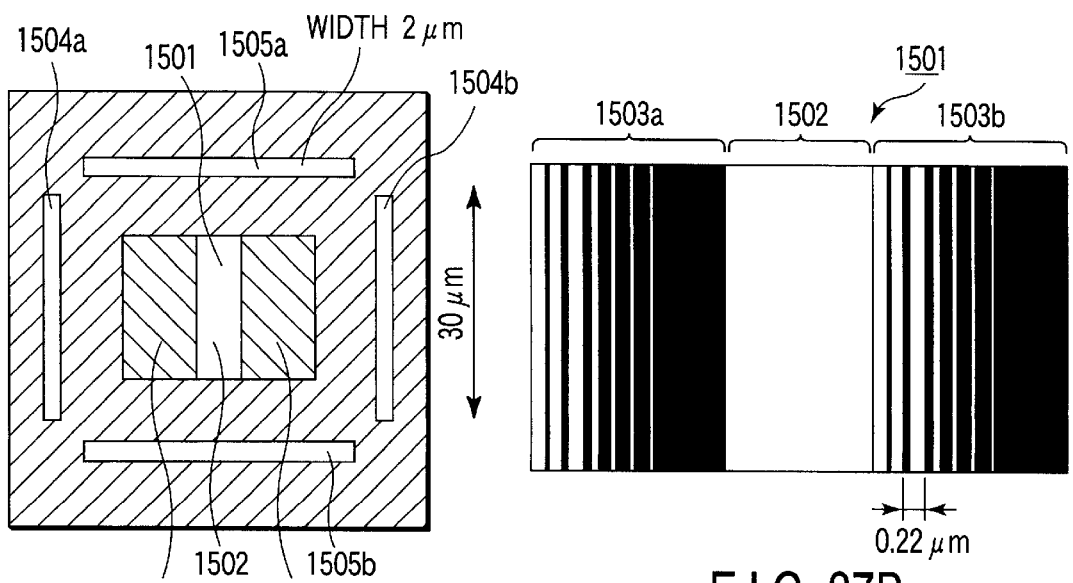
FIG. 27A
FIG. 27B

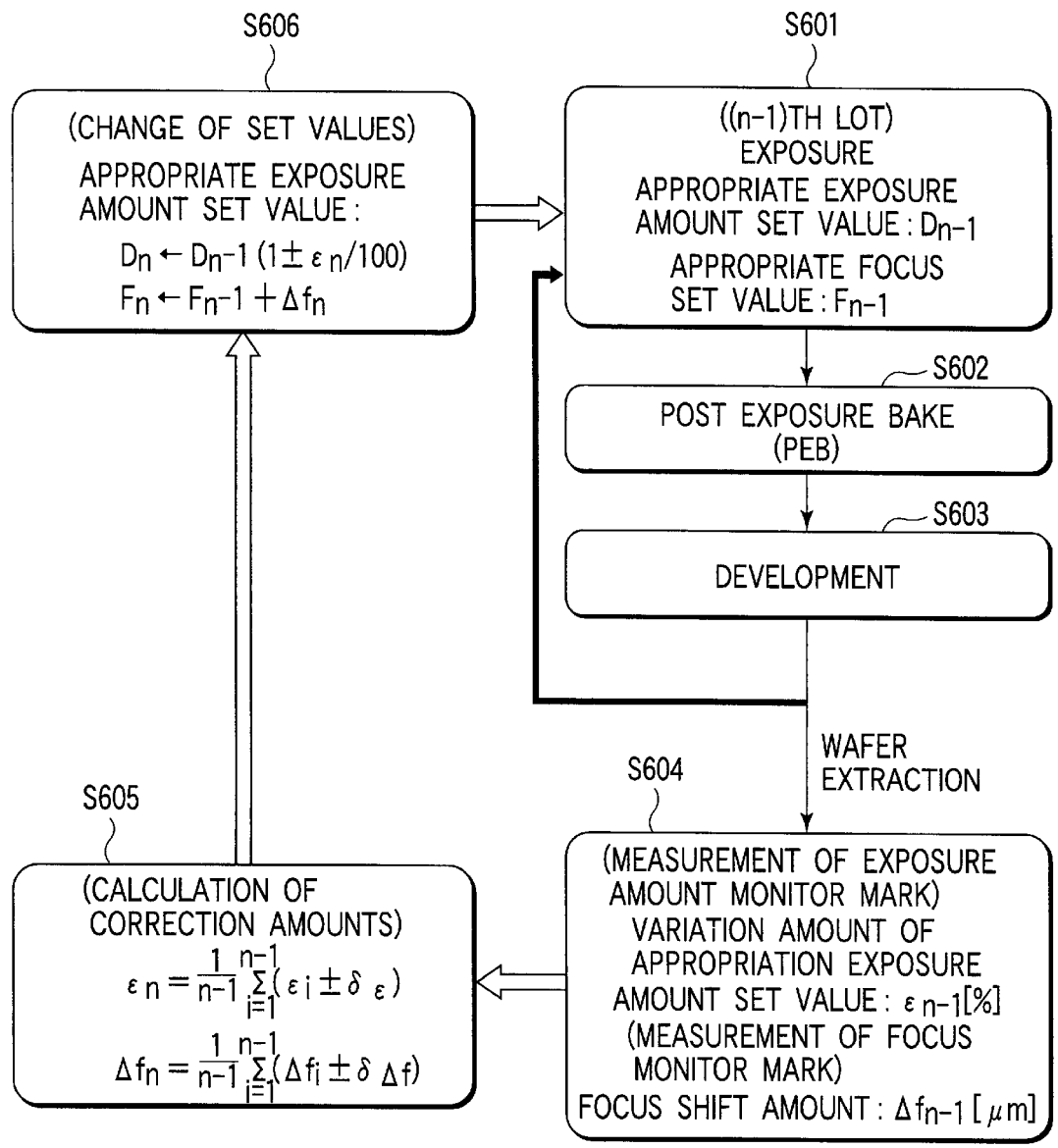
F I G. 37

CONTROL METHOD FOR EXPOSURE APPARATUS AND CONTROL METHOD FOR SEMICONDUCTOR MANUFACTURING APPARATUS

CROSS-REFERENCE TO RELATED APPLICATIONS

This application is based upon and claims the benefit of priority from the prior Japanese Patent Application No. 11-274702, filed Sep. 28, 1999, the entire contents of which are incorporated herein by reference.

BACKGROUND OF THE INVENTION

The present invention relates to an exposure control technique in a semiconductor device manufacturing method and, more particularly, to a control method for an exposure apparatus and a control method for a semiconductor manufacturing apparatus, which can always maintain an optimum process condition in the exposure process.

In the photolithography process in manufacturing a semiconductor integrated circuit, an apparatus called an exposure apparatus for performing pattern exposure is used. An example of the exposure apparatus is a reduction projection exposure apparatus (stepper). In this stepper, light from the light source is transmitted through a mask on which an exposure pattern is drawn so that the pattern is reduced by the optical system and projected onto a wafer.

In pattern formation for transferring a pattern drawn on the mask onto the wafer, the minimum transferable pattern size must be reduced. On the basis of the optical imaging theory, letting NA be the numerical aperture of the projection optical system, and λ be the exposure wavelength, a resolution (line width) R and depth of focus DOF are given by well-known equation:

$$R = k_1 \frac{\lambda}{NA} \quad (1)$$

$$DOF = k_2 \frac{\lambda}{NA^2} \quad (2)$$

where k1 and k2 are process coefficients.

These are called Rayleigh equations and used as criteria to evaluate the imaging performance of a projection exposure apparatus. In response to the demand for shrinkage in feature size of patterns, the exposure wavelength is shortened, the numerical aperture of a projecting lens is increased, and simultaneously, the process is improved. However, since the recent demand for shrinkage in feature size of device patterns is stricter, a sufficient process margin for the exposure amount margin or depth of focus can hardly be obtained, resulting in a decrease in yield.

For photolithography with a small process margin, great importance is being attached to error distribution (error budget) and accurate analysis of error that consumes the process margin. For example, even when a wafer is exposed at the supposedly same set exposure amount to form a number of chips, the effective appropriate exposure amount varies due to PEB (Post Exposure Bake), nonuniformity of development in the wafer surface, or a variation in resist film thickness in the wafer surface, resulting in a decrease in yield. Hence, demand has arisen for an exposure amount and focus control method which effectively uses a small process margin, accurately monitors and feeds back or forward the exposure amount and focus value to prevent a decrease in yield. At the same time, error factors which consume the process margin must be accurately analyzed in units of process units, and major error factors must be removed on the basis of the analysis result.

Two methods have been reported as exposure amount control methods. As the first method, the exposure amount is obtained on the basis of the measurement result of a resist pattern line width or latent image pattern line width. As the second method, the effective exposure amount is obtained on the basis of measurement data of diffraction light intensity that is obtained by irradiating a resist pattern line width or latent image pattern line width with collimated light.

However, the pattern line width changes depending on not only the exposure amount but also the focus value. For this reason, it cannot be determined from the measurement result obtained by the above normal methods whether the line width is affected by a variation in exposure amount value or focus value, or both of them.

On the other hand, two methods have been reported as focus monitor methods. As the first method, the focus value is measured using a variation in size of a monitor mark after exposure due to defocus. As the second method, a variation in focus value is measured as a position shift of a pattern using a mark of phase shift mask type.

In the conventional focus monitor methods, even when the focus shift amount can be obtained and fed back to the focus set value, a variation in appropriate exposure amount value cannot be taken into consideration only using these marks. Hence, the exposure margin cannot be effectively used while suppressing the process variation factors.

The above problems become more serious for finer patterns with a smaller focus margin, or isolated patterns having a smaller feature size. The process variation factors cannot be completely suppressed only by monitoring one of the exposure amount and focus value, and feeding back the obtained measurement result to the set exposure amount, PEB temperature, development time, and the like of the exposure apparatus.

BRIEF SUMMARY OF THE INVENTION

The present invention has been made in consideration of the above situation, and has as its object to provide a control method for an exposure apparatus and control method for a semiconductor manufacturing apparatus, which can suppress a decrease in margin due to process variation factors.

In order to achieve the above object, the present invention has the following arrangement.

(a) According to the present invention, there is provided a control method for an exposure apparatus, in which an exposure amount and a focus value are set in transferring a circuit pattern on a mask onto a resist formed on a wafer by the exposure apparatus, comprising the steps of arranging, on the mask, an exposure amount monitor mark and a focus monitor mark used to separately monitor an effective exposure amount and a focus value on the wafer, transferring the exposure amount monitor mark and the focus monitor mark onto the resist to form an exposure amount monitor pattern and a focus monitor pattern, measuring states of the exposure amount monitor pattern and the focus monitor pattern at least at one of timings after exposure, after post exposure baking, during a cooling process after baking, during a process after cooling, during development, and after development, on the basis of measurement results, calculating a difference between an optimum exposure amount value and an exposure amount set value set in the exposure apparatus and a difference between an optimum focus value and a focus set value set in the exposure apparatus in transferring the exposure amount monitor mark and the focus monitor mark onto the resist, and changing the focus set value and the exposure amount set value of the exposure apparatus in accordance with the calculated differences.

A preferred aspect of the present invention is as follows.

Shapes of the exposure amount monitor pattern and the focus monitor pattern are measured for changes in both of the effective exposure amount and focus shift amount on the resist, which are obtained in advance using the exposure amount monitor mark, and on the basis of measurement results, the difference between the optimum focus value and the focus set value set in the exposure apparatus is calculated in accordance with the shapes of the exposure amount monitor pattern and the focus monitor pattern.

According to the present invention, there is provided a control method for a semiconductor manufacturing apparatus, in which a parameter for photolithography including an exposure process, baking process, cooling process, and development process for transferring a circuit pattern on a mask onto a resist formed on a wafer by an exposure apparatus, comprising the steps of arranging, on the mask, an exposure amount monitor mark and a focus monitor mark used to separately monitor an effective exposure amount and a focus value on the wafer, transferring the exposure amount monitor mark and the focus monitor mark onto the resist to form an exposure amount monitor pattern and a focus monitor pattern, measuring states of the exposure amount monitor pattern and the focus monitor pattern at least at one of timings after the exposure process, after the baking process, during or after the cooling process and during or after the development process, on the basis of measurement results, calculating a difference between an optimum exposure amount value and an exposure amount set value set in the exposure apparatus and a difference between an optimum focus value and a focus set value set in the exposure apparatus in transferring the exposure amount monitor mark and the focus monitor mark onto the resist, and changing at least one of the focus set value of the exposure apparatus, the exposure amount set value of the exposure apparatus, a baking process time in the baking process, a baking process temperature in the baking process, and a development time in the development process in accordance with the calculated differences.

A preferred aspect of the present invention is as follows.

Shapes of the exposure amount monitor pattern and the focus monitor pattern are measured for changes in both of the effective exposure amount and focus shift amount on the resist, which are obtained in advance using the exposure amount monitor mark, and on the basis of measurement results, the difference between the optimum focus value and the focus set value set in the exposure apparatus is calculated in accordance with the shapes of the exposure amount monitor pattern and the focus monitor pattern.

The present invention having the above arrangements has the following functions and effects.

When both the effective exposure amount and the focus shift amount, which are not affected by the focus value, are separately monitored, highly accurate correction can be performed. When exposure conditions are set on the basis of the measurement results, exposure can always be performed with a uniform, maximum exposure margin between lots or wafers or in the wafer surface. For this reason, any decrease in margin or yield due to a process variation can be suppressed.

When the effective exposure amount which is not affected by the focus value is measured using a mark which has a sufficiently large pattern opening and for which a variation in exposure amount can be almost neglected relative to a variation in focus value, or a mark having such a pitch that diffraction light (diffraction light of 1st order or more) at the monitor mark does not enter the pupil of the projecting lens, and only rectilinearly propagating light (0th-order diffraction light) enters the pupil, the pitch of the monitor mark is equal to or smaller than the resolution limit. Hence, flat exposure independently of the focus state can be realized on the wafer surface.

More specifically, assuming an exposure apparatus having an exposure wavelength $\lambda$, a wafer-side numerical aperture NA, a coherence factor $\sigma$ of illumination, and a magnification M of the mask pattern to the pattern on the wafer, the exposure amount monitor mark is formed by repeating a transparent portion and light-shielding portion at a period p, the transparent portion and light-shielding portion are formed on the same mask at a plurality of ratios, and the period p satisfies $$\frac{p}{M} \le \frac{\lambda}{(1+\sigma)NA}. \quad (3)$$

When both of the effective exposure amount detected using such a mark and the focus shift amount obtained from a focus monitor mark are monitored, and parameters for the exposure process are set on the basis of the measurement results, a decrease in margin due to the process variation factors can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a sectional view of an exposure amount monitor mark according to the first embodiment;

FIG. 3B is a plan view of the exposure amount monitor mark according to the first embodiment;

FIG. 4A is a view showing the layout of the exposure amount monitor mark according to the first embodiment;

FIG. 4B is a view showing blocks in the exposure amount monitor mark shown in FIG. 4A;

FIG. 11 is a graph showing the relationship between the focus shift amount and the difference between the pattern lengths $W_v$ and $W_h$ when the effective exposure amount obtained in FIG. 10 changes;

FIG. 12 is a view showing another focus monitor mark according to the first embodiment;

FIG. 13A is a sectional view showing still another focus monitor mark according to the first embodiment;

FIG. 13B is a plan view showing the focus monitor mark according to the first embodiment;

FIG. 14 is a graph showing the relationship (calibration curve) between the defocus value and the size difference (L–L') obtained upon transferring the mark shown in FIGS. 13A and 13B;

FIG. 15 is a graph showing the dose dependence of the calibration curve shown in FIG. 14;

FIG. 16 is a graph showing the relationship between the focus detection sensitivity and the phase difference between the semi-transparent portion and the transparent portion of the mask shown in FIGS. 13A and 13B;

FIG. 17A is a sectional view showing still another focus monitor mark according to the first embodiment;

FIG. 17B is a plan view showing the focus monitor mark according to the first embodiment;

FIG. 18 is a graph showing the relationship (calibration curve) between the defocus value and the size difference (L–L') obtained upon transferring the mark shown in FIGS. 17A and 17B;

FIG. 25 is a view showing the sectional shape of the resist in the section taken along a line A–A' of the exposure amount monitor mark shown in FIG. 22;

FIG. 26 is a graph showing a calibration curve obtained by exposing the exposure amount monitor mark shown in FIG. 22;

FIG. 27A is a plan view showing still another exposure amount monitor mark according to the first embodiment;

FIG. 27B is a plan view showing the structure of an exposure amount monitor pattern in the exposure amount monitor mark shown in FIG. 27A;

FIG. 37 is a flow chart showing the procedure of controlling the exposure amount and focus value in the sixth embodiment.

DETAILED DESCRIPTION OF THE INVENTION

The embodiments of the present invention will be described below with reference to the accompanying drawing.

First Embodiment

Figure 1:
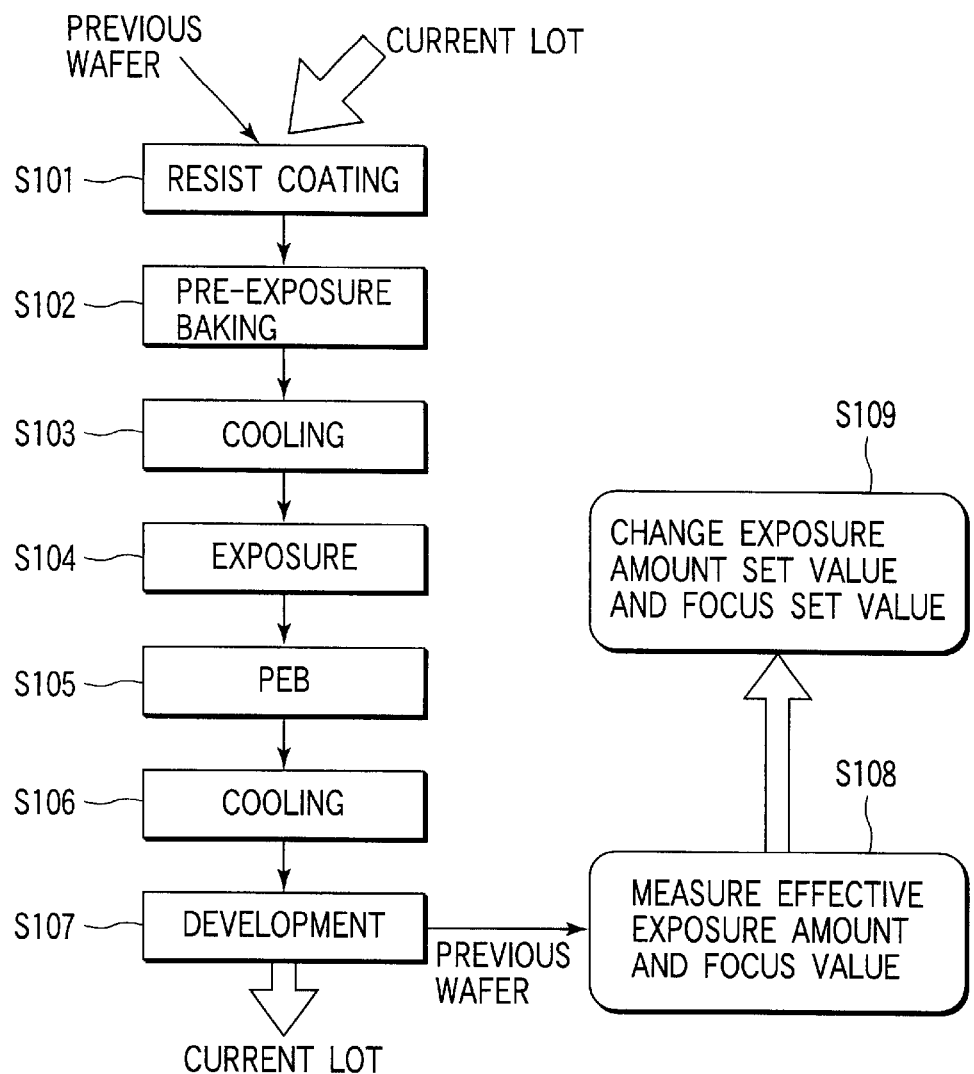
FIG. 1 is a flow chart showing the basic concept in which a method according to the first embodiment is applied to condition determination before lot supply.

FIG. 1 is a flow chart showing the basic concept in which the method according to this embodiment is applied to condition determination before lot supply.

Figure 2:
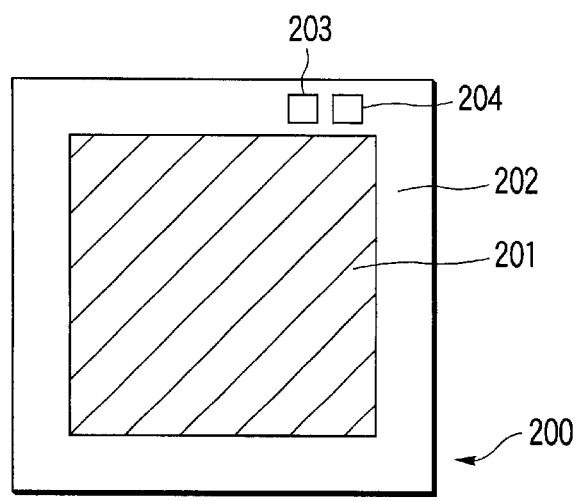
FIG. 2 is a plan view showing the schematic structure of a mask according to the first embodiment.

As shown in FIG. 2, a mask 200 to be used for exposure has, in a dicing region 202 where a device pattern 201 is not included, both an exposure amount monitor mark 203 used to monitor an effective exposure amount and a focus monitor mark 204.

The focus monitor mark 204 is a mark for forming a pattern on a resist depending not on the exposure amount but the focus position, or a mark for obtaining a focus position independently of the exposure amount by using an effective exposure amount independently of the focus position.

The exposure amount monitor mark 203 is a mark for forming a pattern on a resist depending not on the focus position but the exposure amount. The focus monitor mark 204 is a mark for forming a pattern on a resist depending not on the exposure amount but the focus position.

In this embodiment, prior to supply of the current lot, resist coating (step S101), pre-exposure baking (step S102), cooling (step S103), exposure (step S104), post exposure baking (step S105), cooling (step S106), and development (step S107) are performed for a previous wafer. Pre-exposure is done to monitor the effective exposure amount and focus position on the wafer surface, the pattern obtained by exposing the two monitor marks is evaluated, and the variation in appropriate exposure amount and the focus shift amount due to any variation in exposure process are obtained (step S108). The exposure amount set value and focus set value of the exposure apparatus are changed on the basis of the obtained values (step S109).

The exposure amount monitor mark and measurement independently of the focus position will be described first.

FIGS. 3A and 3B are sectional and plan views of the exposure amount monitor mark used in this embodiment, respectively. Referring to FIGS. 3A and 3B, reference numeral 300 denotes a transparent substrate, 301, a Cr film (light-shielding portion); and 302, a space (transparent portion).

Assume an exposure apparatus having an exposure wavelength λ, a wafer-side numerical aperture NA, a coherence factor σ of illumination, and a magnification M of the mask pattern to the pattern on the wafer. The exposure amount monitor mark is formed by repeating, on one mask, a Cr film 301 and space 302 at a period p and at a plurality of ratios of their transparent portions to light-shielding portions. The period p satisfies $$\frac{p}{M} \leq \frac{\lambda}{(1+\sigma)NA}. \quad (3)$$

When the period of the monitor mark is set to the condition of inequality (3), diffraction light (diffraction light of 1st order or higher) at the exposure amount monitor mark does not enter the pupil of the projecting lens, and only rectilinearly propagating light (0th-order diffraction light) enters the pupil. When the above condition is satisfied, the pattern of the monitor mark is equal to or smaller than the resolution limit. When the pattern of the exposure amount monitor mark has a pitch equal to or smaller than the resolution limit, the pattern is not resolved, and flat exposure is attained so that the exposure amount reaching the wafer surface changes depending on the aperture ratio. For this reason, even when the set exposure amount of the exposure apparatus does not change, the effective exposure amount changes in accordance with the aperture ratio. Since the pattern of the exposure amount monitor mark is not resolved, an exposure amount completely free from the influence of a variation in focus value can be obtained.

The exposure conditions used in this case are: the exposure wavelength λ=248 nm, the wafer-side numerical aperture NA=0.6, the coherence factor σ of illumination=0.3, and the magnification M of the mask pattern to the pattern on the wafer=4. Under these conditions, an exposure amount monitor mark having a period p of 1.2 μm (wafer conversion size: 0.3 μm) to satisfy condition (3) was used. The space size was changed in 0.625 nm increments in wafer conversion size.

FIG. 4A is a view showing the layout of the actually used exposure amount monitor mark. As shown in FIG. 4A, the exposure amount monitor mark is segmented into 20 blocks in the X direction and 12 blocks in the Y direction or a total of 240 blocks. As shown in FIG. 4B, each block has an L/S with its particular aperture ratio. Referring to FIG. 4B, reference numeral 301 denotes a light-shielding portion; and 302, an opening portion. A block $401_{first}$ at the upper left corner in FIG. 4A has the minimum space size, and a block $401_{end}$ at the lower right corner has the maximum space size.

The calibration curve between the exposure amount set value and the effective exposure amount of the exposure apparatus was obtained in advance using the exposure amount monitor mark. This effective exposure amount is defined as an exposure amount which includes all final exposure process factors. A procedure of obtaining the calibration curve of the effective exposure amount will be described below.

A 60-nm thick anti-reflection film was formed on an Si wafer by spin coating and then baking. A 0.4-μm thick chemical amplification positive resist was also coated by spin coating. After that, the resultant structure was prebaked at 100° C. for 90 sec. The series of processes were executed in a track connected to an exposure apparatus for processing the current lot. The wafer that has undergone these processes was transferred to the exposure apparatus, and was exposed to form an exposure amount monitor mark. The exposure amount set value of the exposure apparatus was increased in 0.2 mJ/cm² increments from 5 mJ/cm² to 25 mJ/cm². The exposed wafer was transferred to the track again, baked by PEB (Post Exposure Bake) at 100° C. for 90 sec, and developed for 60 sec using a 0.21N alkali developing solution. The pattern on this wafer was observed with an optical microscope.

Figure 5:
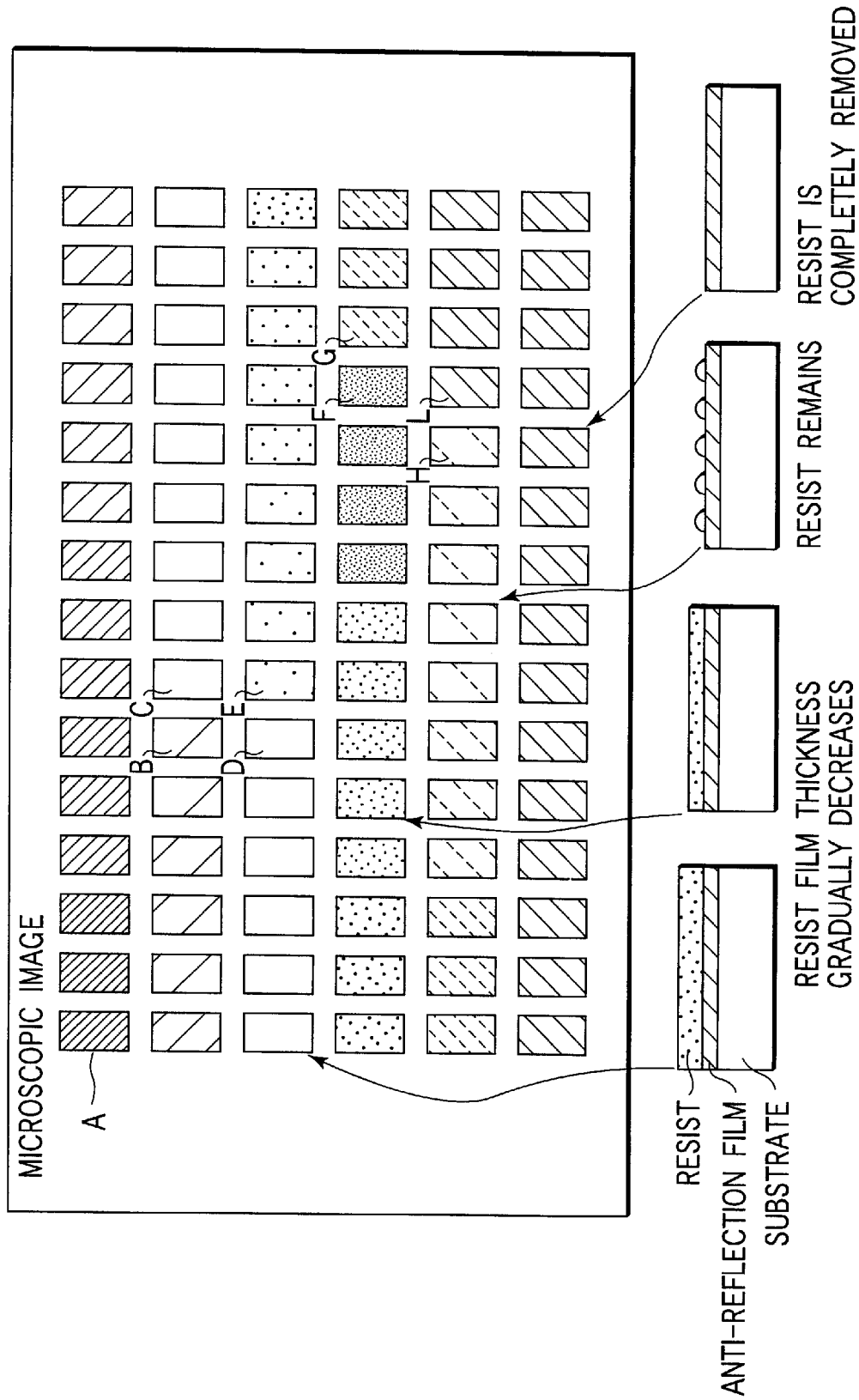
FIG. 5 is a view showing an observation result of patterns on an exposed wafer.

FIG. 5 is a view showing a microscopic image at an exposure amount set value of 7.5 mJ/cm². FIG. 5 schematically shows part of the transferred image of the exposure amount monitor mark shown in FIG. 4A onto the wafer. Each of rectangles A, B, ... in FIG. 5 corresponds to a block shown in FIG. 4A. As is apparent from FIG. 5, the resist film thickness decreases in accordance with the space width of the L/S.

Referring to FIG. 5, on the microscope, as the resist film thickness gradually decreases from point A to point B, the image gradually looks brighter due to the influence of interference. The image is almost constant from point C to point D. The layer under the resist starts showing itself through from point E, and the color gradually changes toward point F. The layer under the resist starts being exposed from point G, and the color is nonuniform until point H due to the influence of residual resist. Point I at which the resist is completely removed can be easily recognized in this microscopic image. The position where the resist was completely removed was monitored and used as a reference for measurement of the effective exposure amount.

Figure 6:
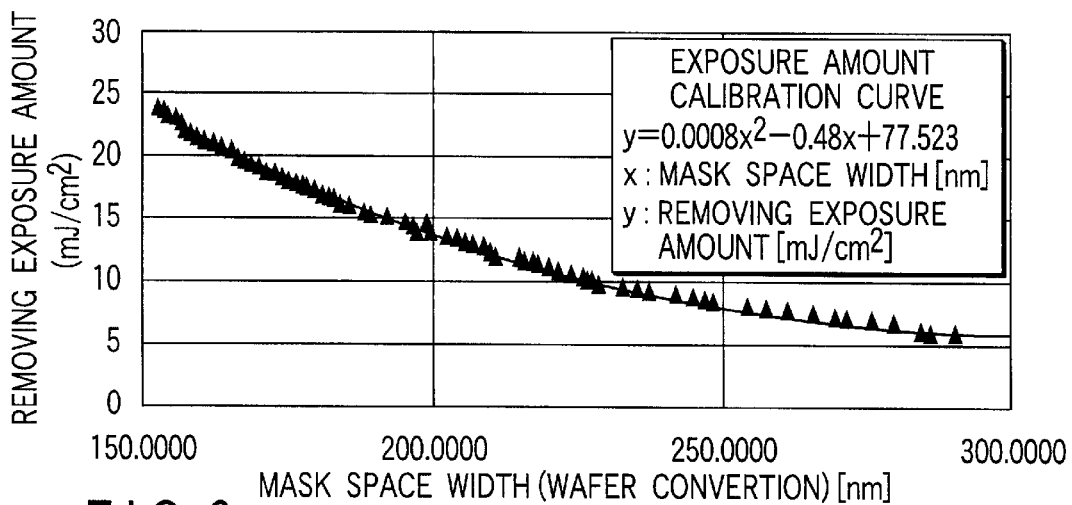
FIG. 6 is a graph showing the relationship between a mask space width (wafer conversion size) and the exposure amount set value (removing exposure amount) of the exposure apparatus, which correspond to a position where the resist is completely removed in the exposure amount monitor mark according to the first embodiment.

FIG. 6 is a graph showing the relationship between the mask space width (wafer conversion size) and the exposure amount set value (removing exposure amount) of the exposure apparatus, which correspond to a position where the resist is completely removed. As is apparent from FIG. 6, a portion having a large mask space width is sensitive to a change in exposure amount. In this embodiment, using the graph shown in FIG. 6 as a calibration curve, an effective exposure amount was defined on the basis of the mask space width at a position where the resist was completely removed.

In this case, an exposure amount monitor mark having a layout of L/S patterns with different aperture ratios was used. However, the patterns are not limited to L/S patterns. The exposure amount monitor mark can also be formed by laying out periodical hole patterns or repetitive rhombic patterns.

Alternatively, a sufficiently large opening pattern may be formed such that flat exposure which does not vary due to a variation in focus value is achieved, and a semi-transparent film may be formed on the mask while changing the film thickness stepwise to change the intensity ratio of light passing through that opening portion stepwise.

In this embodiment, a mask space width corresponding to a film thickness at a position where the resist is completely removed was used as a monitor reference. However, the present invention is not limited to this. Instead, the residual resist amount may be monitored by a film thickness meter or the like, and control may be done with reference to the film thickness value.

The focus monitor mark and measurement of the focus value independently of the exposure amount will be described next.

Figure 7:
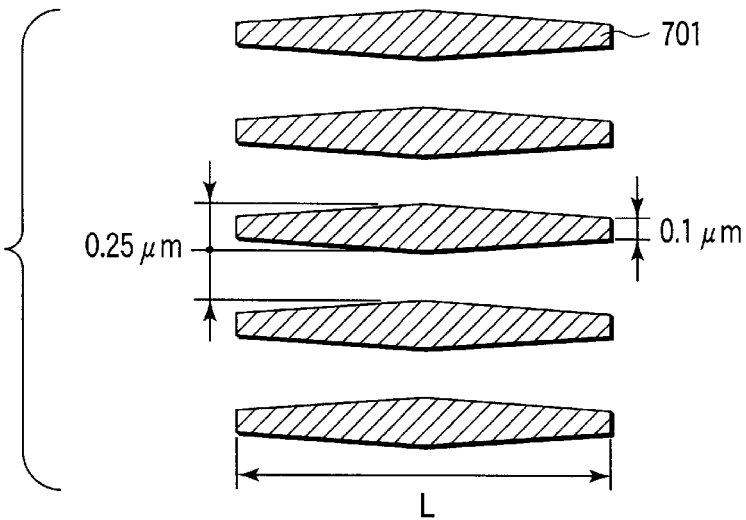
FIG. 7 is a plan view showing focus monitor marks according to the first embodiment.

The focus monitor mark used is of a type for measuring the focus position on the basis of a variation in size of the monitor mark due to defocus after exposure. FIG. 7 is a plan view showing the focus monitor mark used in this embodiment (the size is a wafer conversion size). As shown in FIG. 7, a focus monitor mark 701 has a width of 0.25 $\mu$m at the central portion and a width of 0.1 $\mu$m at the distal end portions, i.e., becomes narrower from the central portion to the distal end portions. Five focus monitor marks 701 are laid out at an interval of 0.25 $\mu$m.

The present inventor noted the fact that the exposure amount and focus value can be separately obtained as independent parameters by calibrating the behavior of a size W after transfer of a pattern length L of the focus monitor mark 701 shown in FIG. 7 in advance with respect to the effective exposure amount (in this case, the mask space width at a position where the resist is completely removed) obtained by measuring the exposure amount monitor mark.

The focus calibration curve was obtained by performing exposure while changing the set exposure amount and focus position of the exposure apparatus. The exposure amount was converted into an effective exposure amount obtained from the above-described exposure amount monitor mark independently of the focus value, and finally, the relationship between the effective exposure amount, the defocus value, and the pattern length W was obtained.

Figure 8:
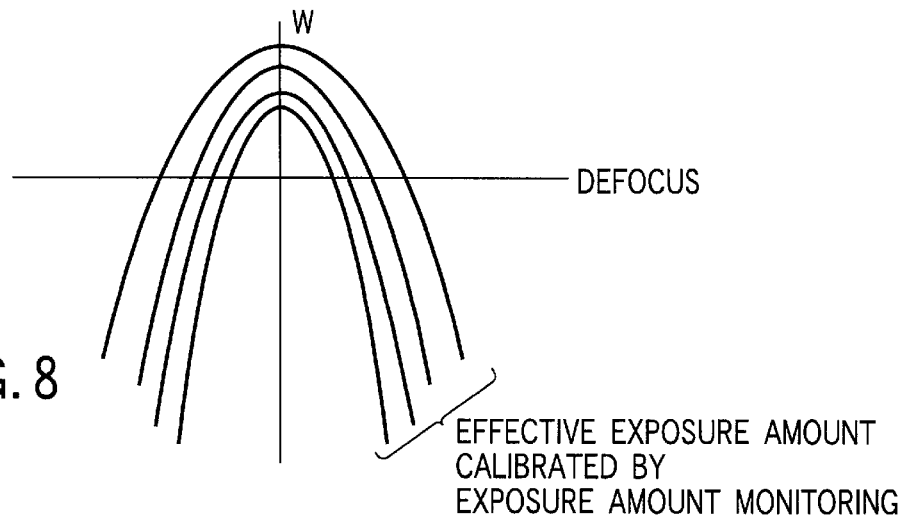
FIG. 8 is a graph showing the focus dependence of a pattern length W of the focus monitor mark at an effective exposure amount calibrated by the exposure amount monitor mark according to the first embodiment.

FIG. 8 is a graph showing the focus dependence of the pattern length W of the focus monitor mark (FIG. 7) at the effective exposure amount calibrated by the exposure amount calibration curve shown in FIG. 6. A procedure of obtaining the exposure amount and focus set value of the exposure apparatus on the basis of exposure of a previous wafer will be described next. In obtaining the calibration curve, an optimum exposure amount which satisfies both of the desired focus margin and exposure amount margin is 10.023 mJ/cm$^2$, and as the effective exposure amount at that time corresponds to a space size of 225 nm, at which the resist of the pattern of the exposure amount monitor mark is removed.

(Exposure Procedure 1)
In consideration of the above optimum exposure conditions, the entire previous wafer was exposed at an exposure amount set value of 10.023 mJ/cm$^2$ and focus offset of 0 $\mu$m.

(Exposure Procedure 2)
The exposure amount monitor mark and focus monitor mark were measured in at least one shot in accordance with the specifications of these marks.

More specifically, the exposure amount monitor mark and focus monitor marks were measured at five points in the wafer surface. An optical microscope was used to measure the exposure amount monitor mark. The same optical line width measuring apparatus as that used to obtain the focus calibration curve was used to measure the focus monitor marks.

(Exposure Procedure 3)
In accordance with the calibration curves (FIGS. 6 and 8 in this embodiment), the effective exposure amount and focus shift amount were obtained, and the average value of five points was obtained. The effective exposure amount obtained from the exposure amount monitor mark corresponded to a monitor mark space interval of 230 nm, and the focus shift amount was 0 $\mu$m.

(Exposure Procedure 4)
On the basis of the monitor result (exposure procedure 3) of the previous wafer, the exposure amount set value and focus offset amount in the current lot were determined, and exposure was performed.

This will be described in more detail.

The exposure amount with which the maximum margin is available corresponds to a space interval of 225 nm in the exposure amount monitor mark. As is apparent from FIG. 6, the removing exposure amount value is 10.023 mJ/cm$^2$ from the approximate expression of removing exposure amount. However, observation of the exposure amount monitor mark for the previous wafer revealed that the space interval was 230 nm, and the removing exposure amount decreased to an effective exposure amount of 9.443 mJ/cm$^2$. Hence, exposure was performed while adding the decrease amount of the effective exposure amount, 5.7% ((10.023−9.443)/10.023) the exposure amount set value of the exposure apparatus.

With this method, the variation in appropriate exposure amount and the focus shift, which are generated due to a variation in film thickness of the resist and anti-reflection film between lots or a variation in temperature in the baker, are separately monitored by measuring the exposure amount monitor mark and focus monitor marks after exposure. This enables highly accurate correction. Since the current lot is always exposed with the maximum exposure margin, the decrease in yield can be suppressed.

In the above example, the focus shift amount is 0 $\mu$m. If a shift amount is present, the focus shift direction cannot be detected with the focus monitor marks 701 shown in FIG. 7, and therefore, the direction in which the offset amount should be added for the focus position, + or − direction, cannot be determined. Hence, when the focus monitor mark shown in FIG. 7 is used, the focus offset direction is determined on the basis of the tendency of focus shift using QC data or the like obtained at the site.

The present inventor also formed focus monitor marks rotated from those shown in FIG. 7 through 90°, and monitored the focus shift amount using the astigmatism of the exposure apparatus used. It was already known that the difference in focus position between the 90°-direction pattern and the 0°-direction pattern was 0.2 $\mu$m in the apparatus used. When astigmatism is used, the shift direction of focus position can also be monitored.

Figure 9:
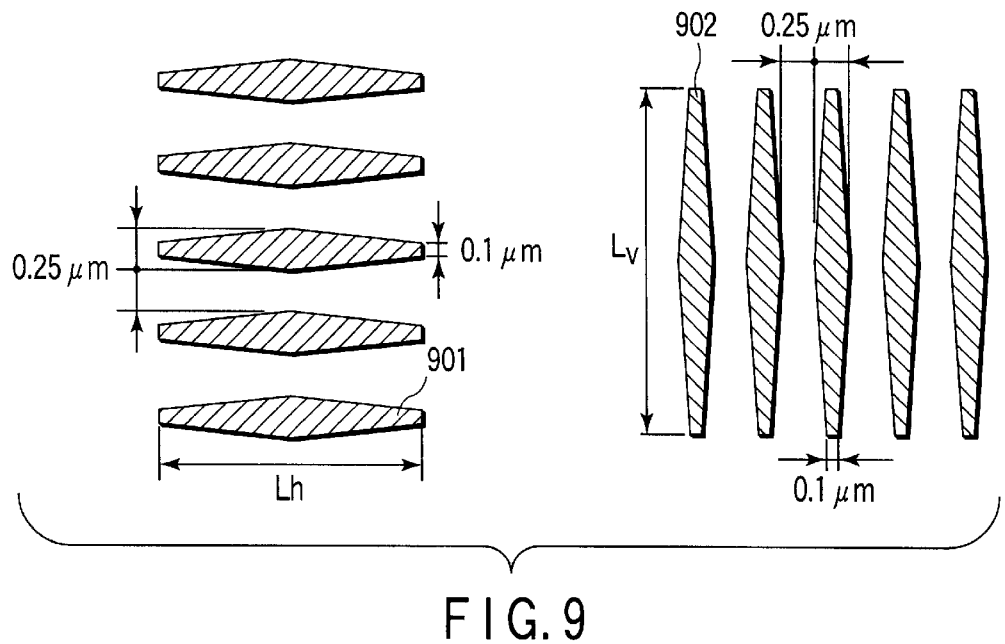
FIG. 9 is a view showing focus monitor marks according to the first embodiment, which can also determine the focus shift direction.

FIG. 9 is a view showing focus monitor marks which can also determine the focus shift direction. As shown in FIG. 9, focus monitor marks 901 and 902 like the focus monitor marks shown in FIG. 7 are laid out to be perpendicular to each other.

When the behavior of sizes $L_v$ and $L_h$ of the focus monitor marks 901 and 902 shown in FIG. 9 and pattern lengths $W_v$ and $W_h$ after exposure and development is calibrated in advance with respect to the effective exposure amount obtained by measuring the exposure amount monitor mark, the exposure amount and focus value can be separately obtained as independent parameters. The method of monitoring the focus shift amount will be described below in more detail.

Figure 10:
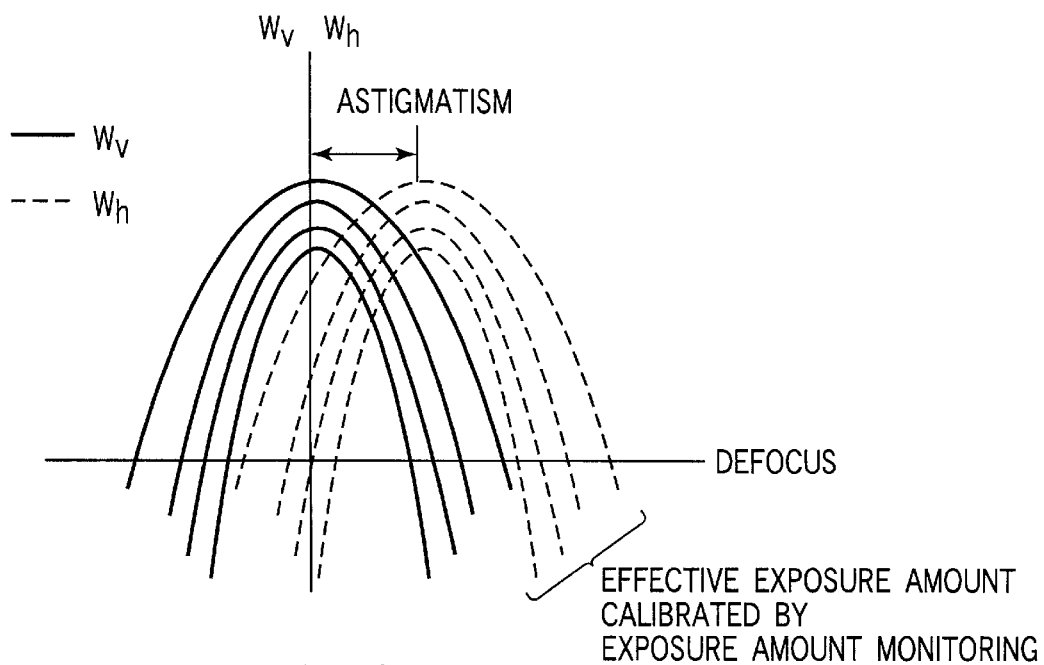
FIG. 10 is a graph showing the dependence of pattern lengths $W_v$ and $W_h$ of sizes $L_v$ and $L_h$ of focus monitor marks in two directions after exposure on an effective exposure amount obtained by exposing the focus monitor marks shown in FIG. 9 in the first embodiment.

FIG. 10 is a graph showing the dependence of the pattern lengths $W_v$ and $W_h$ of sizes $L_v$ and $L_h$ of focus monitor marks in two directions after exposure on the effective exposure amount obtained by exposing the focus monitor marks 901 and 902 shown in FIG. 9. The present inventor noted the fact that although the pattern lengths $W_v$ and $W_h$ themselves change in accordance with the exposure amount, the difference between the pattern lengths does not so largely change with respect to the variation in exposure amount near the just focus position. FIG. 11 is a graph showing the relationship between the focus shift amount and the difference between the pattern lengths $W_v$ and $W_h$ when the effective exposure amount changes from FIG. 10. Using the focus calibration curve shown in FIG. 11, the focus shift amount (including direction) could be obtained from the difference between the pattern lengths $W_v$ and $W_h$ and fed back to the focus set value of the exposure apparatus.

In this case, aberrations except the astigmatism are not conspicuous between the 0°-direction pattern and the 90°-direction pattern. However, when another aberration is conspicuous, the difference between the 0°-direction pattern and the 90°-direction pattern, which is generated in manufacturing a mask, is conspicuous, the focus shift amount is large, or the focus monitor accuracy is to be increased, a calibration curve which considers not only the difference between the pattern lengths $W_v$ and $W_h$ obtained from the focus monitor marks but also the effective exposure amount obtained from the exposure amount monitor mark is used. In this case, patterns in the 0°- and 90°-directions are used. However, the directions are not limited to those, and any other patterns can be used as long as the two patterns have best focus positions in different directions.

Thus, since the focus shift direction can also be monitored, the focus shift amount can be accurately corrected, and the current lot can exposed with the maximum exposure margin, the decrease in yield can be suppressed.

As another method of monitoring the shift amount of focus position without any influence of a variation in exposure amount, a technique of measuring a variation in focus value as a positional shift of the pattern using a mark of phase shift mask type may be used. For example, as a focus monitor mark of a type for measuring a variation in focus value as a positional shift of the pattern, a mark (FIG. 12) described in "Phase shift focus monitor applications to Lithography tool control (D. Wheeler et al., SPE vol. 3051, pp. 225–233)" may be used. Referring to FIG. 12, reference numeral 1201 denotes a phase shift glass; 1202, a phase non-shift glass; and 1203, a light-shielding film. As a calibration method in this case, the focus monitor mark shown in FIG. 12 is exposed while changing the defocus position, the relationship between the positional shift amount and focus shift amount, which is obtained by a misalignment overlay inspection equipment, is obtained as a focus calibration curve, and the shift amount is fed back to the optimum focus set value of the exposure apparatus on the basis of the calibration curve.

As still another method of monitoring the shift amount of focus position without any influence of a variation in exposure amount, an applicable focus monitor mark other than the above-described focus monitor mark will be described.

FIGS. 13A and 13B are sectional and plan views, respectively, for explaining the schematic structure of still another focus monitor mark. The monitor pattern is formed on the light-shielding portion in a region (dicing line) of the mask, where no device pattern is present. Referring to FIGS. 13A and 13B, reference numeral 2011 denotes a transparent substrate made of glass or the like; 2012, a semi-transparent film made of $SiO_2$ or the like; 2013, a light-shielding film made of Cr or the like; 2001, a rhombic mark (first opening portion) formed in the light-shielding film 2013; and 2002, a rhombic mark (second opening portion) formed in the semi-transparent film 2012. The semi-transparent film 2012 has a transmittance of 6% for exposure light and a function of shifting the phase by 180°.

In each of the first pattern region having the rhombic marks 2001 and the second pattern region having the rhombic marks 2002, five marks are laid out at a predetermined pitch. Each of the rhombic marks 2001 and 2002 has a length of 12 $\mu$m in the X-axis direction and a width of 0.18 $\mu$m in the Y-axis direction as wafer conversion values. The pitch is 0.36 $\mu$m. At the portion of the rhombic mark 2002 as the second opening portion, the substrate is etched by, e.g., 124 nm to generate a phase difference of 90° between exposure light transmitted through the semi-transparent film 2012 and that transmitted through the opening portion 2002.

When the phase difference of almost 90° is generated between exposure light transmitted through the semi-transparent film 2012 and that transmitted through the opening portions 2001 and 2002, the focus point of a rhombic pattern formed on the wafer by the mark 2002 of the semi-transparent film portion shifts from that of a rhombic pattern formed on the wafer by the mark 2001 of the light-shielding film portion, and different pattern size characteristics are exhibited for defocus. When the difference in pattern size between the two marks after exposure/development is monitored, the difference monotonically increases or decreases with respect to the defocus value. Using this fact, the relationship between the defocus value and the pattern size difference is obtained as a calibration curve. When the pattern size difference on the wafer after exposure/development is measured, the focus shift amount can be monitored, including the shift direction.

A procedure of detecting the focus point using the rhombic marks of two types will be described next. To transfer the pattern of the focus monitor mark of this embodiment, which has the above marks, onto a wafer, exposure was performed under the same exposure conditions as those for the device pattern. A 60-nm thick anti-reflection film was formed on the wafer by spin coating, and then a 0.4-$\mu$m thick chemical amplification positive resist was also coated by spin coating. Using the mask, this wafer was exposed under exposure conditions that the reduction ratio of the projection optical system was ¼, the exposure wavelength was 248 nm, the NA was 0.6, the coherence factor $\sigma$ was 0.75, the annular zone shielding ratio $\epsilon$ was 0.67, and the set exposure amount of the exposure apparatus was 7.5 mJ/cm$^2$.

The exposed wafer was baked by PEB (Post Exposure Bake) at 100° C. for 90 sec and developed for 60 sec using a 0.21N alkali developing solution.

The line widths of the rhombic patterns of two types on the processed wafer were measured using an optical line width measuring device. The difference between a pattern size L' in the X-axis direction of the rhombic mark 2002 of the semi-transparent film portion and a pattern size L in the X-axis direction of the rhombic mark 2001 of the light-shielding film portion was obtained.

FIG. 14 is a graph showing the relationship (calibration curve) between the defocus value and the size difference (L–L') obtained by exposure. The abscissa of this graph represents the defocus value, and the ordinate represents the pattern size (L or L') and size difference between the rhombic marks 2001 and 2002. Of the three curves, the solid line represents the pattern size characteristics of the rhombic mark 2001 of the light-shielding film portion, the dotted line represents the pattern size characteristic of the rhombic mark 2002 of the semi-transparent film portion, and the alternate long and short dashed line represents the characteristic of the size difference obtained by subtracting the rhombic pattern size of the light-shielding film portion from that of the semi-transparent film portion for the defocus value. Since this size difference characteristic monotonically increased with respect to the defocus value, the positional shift amount of focus could be obtained, including a sign.

Additionally, the dependence of the calibration curve on the exposure amount was checked while changing the exposure amount in exposure. More specifically, exposure was performed while changing the exposure amount within the range of −10% to +10% from 7.5 mJ/cm² as the center. FIG. 15 is a graph showing the dose dependence of the relationship (calibration curve) between the size difference and the defocus value. This graph shows the relationship between the size difference and the defocus value when the exposure amount was changed to −10%, −5%, −1%, −7.5 mJ/cm², +1%, +5%, and +10% with reference to 7.5 mJ/cm² as the center.

As is apparent from this graph, even when the dose is changed within the range of −10% to +10%, the defocus dependence hardly changes (the lines in the graph almost overlap). Hence, even when the exposure amount changed, the focus positional shift amount could be accurately detected using the focus monitor mark of this embodiment.

In this embodiment, the focus detection mark is detected using an optical line width measuring device separated from the exposure apparatus. However, a line width measuring function incorporated in the exposure apparatus itself, or a measuring device such as an SEM other than an optical device may be used. The monitor pattern may have a wedge shape as far as it can be measured by the line width measuring device. The rhombic or wedge shape need not always have a sharp distal end, and the function as the focus monitor mark can be obtained as long as the distal end portion is narrower than the central portion. When the size and pitch of the focus monitor mark and the transmittance of the semi-transparent film portion are changed in accordance with the exposure conditions to be used, the focus detection performance can be further improved.

The relationship between the light-shielding portion and the opening portion in the first pattern region may be reversed. More specifically, a rhombic- or wedge-shaped monitor pattern formed from a light-shielding film may be formed to be surrounded by an opening portion. The relationship between the semi-transparent film portion and the opening portion in the second pattern region may also be reversed.

More specifically, a rhombic- or wedge-shaped monitor pattern formed from a semi-transparent film may be formed to be surrounded by an opening portion. The same effect as in this embodiment can be obtained by any one of the combinations.

In this embodiment, the semi-transparent film 2012 having a phase difference of 90° is used to generate a phase difference between exposure light transmitted through the opening portion 2002 in the second pattern region and that transmitted through the portion around the opening portion. However, the phase difference is not limited to 90°. Any other phase difference can be used as far as the best focus position of the rhombic mark 2001 of the light-shielding film portion changes from that of the rhombic mark 2002 of the semi-transparent film portion. For the semi-transparent film, not only $SiO_2$ but also molybdenum silicide oxynitride (MoSiON), molybdenum silicide nitride (MoSiN), chromium fluoride (CrF), or zirconium silicide (ZrSiO) can be used.

FIG. 16 is a graph showing the relationship between the focus detection sensitivity and the phase difference between the semi-transparent film portion and the transparent portion of the mask shown in FIGS. 13A and 13B. Referring to FIG. 16, when the required focus shift amount detection accuracy is 0.05 μm, and the measuring accuracy of the line width measuring device is about 0.02 μm, the limit of detection sensitivity required for focus monitor is sensitivity (size difference/defocus value)=|ΔL−ΔL'|/|Δfocus|=0.8, so a detection sensitivity of 0.8 or more is required. Hence, the phase difference must be set within the range of 45° to 150°.

A mark more accurate than the focus monitor mark shown in FIGS. 13A and 13B will be described next. A rhombic mark made from a semi-transparent film is formed on an exposure mask as a monitor pattern (mark) used to measure the focus point. This mark is different from the above-described mark in that a semi-transparent film is formed in both of the first and second pattern regions, a phase difference of +90° is generated in the first pattern region, and a phase difference of −90° is generated in the second pattern region by forming the rhombic mark.

FIGS. 17A and 17B are sectional and plan views, respectively, for explaining the schematic structure of the focus monitor mask. The monitor pattern is formed on the light-shielding portion in a region (dicing line) of the mask, where no device pattern is present. Referring to FIGS. 13A and 13B, reference numeral 2311 denotes a transparent substrate; 1312, a semi-transparent film; 1313, a light-shielding film; and 2321 and 2322, rhombic marks formed on the semi-transparent film 1312. The semi-transparent film 1312 has a transmittance of 6% for exposure light and a function of shifting the phase by 180°.

In the first pattern region where the rhombic mark (first opening portion) 2321 is formed, the substrate 2311 exposed to the opening portion is partially etched (by, e.g., 124 nm) to generate a phase difference of +90° between light transmitted through the rhombic mark 2321 as an opening portion and that transmitted through the semi-transparent film 1312 around the rhombic mark 2321. In the second pattern region where the rhombic mark (second opening portion) 2322 is formed, the substrate 2311 exposed to the opening portion is partially etched (by, e.g., 372 nm) to generate a phase difference of −90° between light transmitted through the rhombic mark 2322 as an opening portion and that transmitted through the semi-transparent film 1312 around the rhombic mark 2322.

In each of the first and second pattern regions, five marks are laid out at a predetermined pitch. Each of the rhombic marks 2321 and 2322 has a length of 12 μm in the X-axis direction and a width of 0.18 μm in the Y-axis direction as wafer conversion values. The pitch is 0.36 μm.

As described above, when the patterns were formed on a wafer using a mask having rhombic marks at the light-shielding film portion and semi-transparent film portion, the pattern size difference between the formed mark of the light-shielding film portion and that at of the semi-transparent film portion monotonically decreased or increased with respect to the defocus value.

To further improve the focus shift amount detection sensitivity, the present inventor has shifted the phase of exposure light transmitted through the semi-transparent film 1312 by almost +90° with respect to exposure light transmitted through the rhombic mark 2321 in the first pattern region, and the phase of exposure light transmitted through the semi-transparent film 1312 by almost −90° with respect to exposure light transmitted through the opening portion 2322 in the second pattern region. The shift amount between the focus point of the rhombic mark 2321 of the semi-transparent film portion, which has a phase difference of about +90° with respect to exposure light transmitted through the opening portion 2321 and the focus point of the rhombic mark formed in the light-shielding film portion changes by the same amount as that of the above-described mark.

To the contrary, the shift amount between the focus point of the rhombic mark 2322 of the semi-transparent film portion, which has a phase difference of about −90° with respect to exposure light transmitted through the opening portion 2322 and the focus point of the rhombic mark formed in the light-shielding film portion has the same absolute value as that of the above-described shift amount and a sign opposite to the shift amount. As a consequence, the focus shift amount detection sensitivity can be made higher by twice than that of the above-described mark.

Rhombic mark patterns were formed on a resist under the same conditions as those for the above-described mark, the pattern sizes of the two rhombic marks formed on the wafer were measured using an optical line width measuring device, and the difference between the sizes was obtained.

FIG. 18 is a graph showing the relationship (calibration curve) between the defocus value and the size difference (L–L') obtained by exposure. The abscissa of this graph represents the defocus value, and the ordinate represents the pattern size (L or L') and size difference between the rhombic marks 2321 and 2322. Of the three curves, the solid line represents the pattern size characteristics of a pattern transferred to the wafer by the rhombic mark 2321 formed on the semi-transparent film portion and having a phase difference of +90° with respect to the opening portion, and the dotted line represents the pattern size characteristics of a pattern transferred to the wafer by the rhombic mark 2322 formed on the semi-transparent film portion and having a phase difference of −90° with respect to the opening portion.

The alternate long and short dashed line represents the size difference (L–L') obtained by subtracting the pattern length L' transferred to the wafer by the rhombic mark 2322 formed on the semi-transparent film portion and having a phase difference of −90° with respect to the opening portion from the pattern length L transferred to the wafer by the rhombic mark 2321 formed on the semi-transparent film portion and having a phase difference of +90° with respect to the opening portion. As is apparent from these results, the focus shift amount detection sensitivity is about twice that of the above-described mark.

Figure 19:
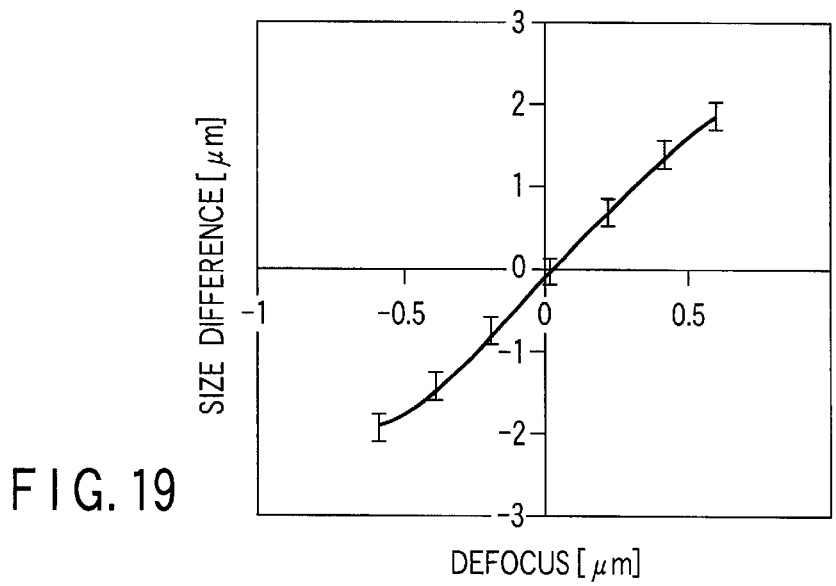
FIG. 19 is a graph showing the dose dependence of the calibration curve shown in FIG. 18.

Additionally, the dependence of the calibration curve on the exposure amount was checked while changing the exposure amount in exposure. More specifically, exposure was performed while changing the exposure amount within the range of −10% to +10% from 7.5 mJ/cm$^2$ as the center. FIG. 19 is a graph showing the dose dependence of the relationship (calibration curve) between the defocus value and the size difference of the monitor pattern. This graph shows the relationship between the size difference and the defocus value when the exposure amount was changed to −10%, −5%, −1%, −7.5 mJ/cm$^2$, +1%, +5%, and +10% with reference to 7.5 mJ/cm$^2$ as the center.

As is apparent from this graph, even when the dose is changed within the range of −10% to +10%, the defocus dependence hardly changes (the lines in the graph almost overlap). Hence, even when the exposure amount varied, the focus positional shift amount could be accurately detected using these marks.

Still another applicable focus monitor mark other than the mark shown in FIGS. 3A, 3B, 4A, and 4B will be described next.

The exposure amount monitor mark is not limited to the type shown in FIGS. 3A, 3B, 4A, and 4B, and a type disclosed in "Exposure Monitor Structure (Alexander Staikov, SPIE vol. 1261, pp. 315–324)" of a prior art may be used. As a characteristic feature of this proposal, using a pattern having a pitch that is not resolved by a projection exposure apparatus to be used, a pattern for which the size ratio (duty ratio) of the transparent portion to the light-shielding portion is continuously changed is arranged, thereby forming a pattern having a graded distribution of dose independently of the focus state on a wafer.

Figure 20:
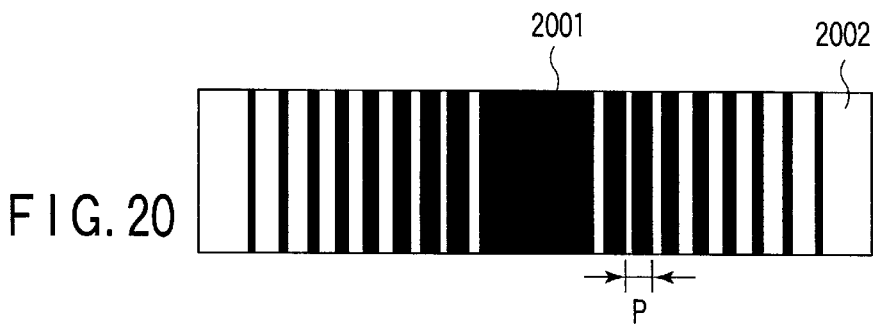
FIG. 20 is a plan view showing still another exposure amount monitor mark according to the first embodiment.

FIG. 20 is a plan view showing an example of the exposure amount monitor mark of the above type. Referring to FIG. 20, reference numeral 2001 denotes a light-shielding portion; and 2002, a transparent portion. In this monitor pattern, the size of the transparent portion increases from the center in the horizontal direction while keeping a fixed pitch. Reference symbol P denotes a pitch at which the pattern is not resolved under exposure conditions to be used.

Considering exposure conditions used in this case, i.e., the exposure wavelength λ=248 nm, the numerical aperture NA=0.6, and the coherence factor σ=0.3, the present inventor used a monitor mark period of 0.3 μm as a wafer conversion size to satisfy condition (3) under which diffraction light (diffraction light of 1st order or more) in the mask pattern did not enter the pupil of the projecting lens, and only rectilinearly propagating light (0th-order diffraction light) entered the pupil.

Figure 21:
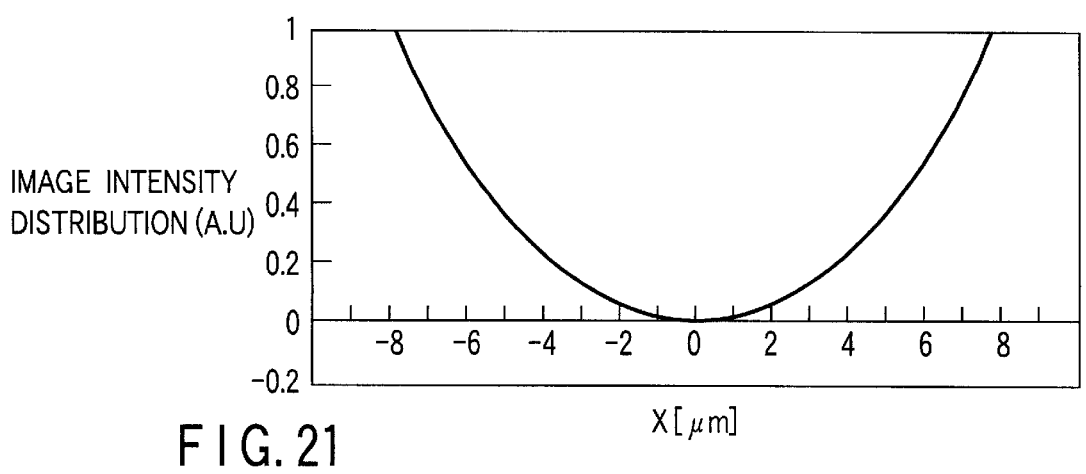
FIG. 21 is a graph showing the image intensity distribution in the section taken along a line A–A' on the wafer surface obtained upon transferring the exposure amount monitor mark shown in FIG. 20.

FIG. 21 is a graph showing the image intensity distribution in the section taken along a line A–A' on the wafer surface obtained upon transferring the exposure amount monitor mark shown in FIG. 20. Since the wafer surface is irradiated with only the 0th-order diffraction light diffracted by the monitor mark, the image intensity has a distribution proportional to the second power of the area of the transparent portion. When the exposure amount set value of the exposure apparatus is changed using this mask, exposure is performed, and the pattern is measured using an optical line width measuring device, a calibration curve for obtaining an effective exposure amount can be obtained. The same exposure amount control method as described above can be applied using this calibration curve.

As still another type, an application example of an exposure amount monitor mark with which the exposure amount can be easily and highly accurately monitored at a high speed using the misalignment measuring function of a misalignment overlay inspection equipment will be described below in detail.

Figure 22:
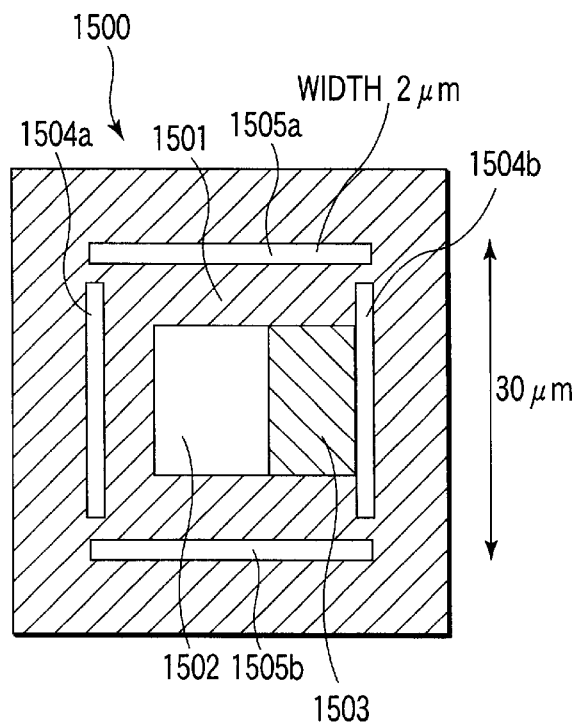
FIG. 22 is a plan view showing still another exposure amount monitor mark according to the first embodiment.

The present inventor changed some marks used in the conventional misalignment overlay inspection equipment to marks capable of detecting the variation amount of exposure amount as a positional shift of the pattern. Letting λ be the exposure wavelength to be used, NA be the numerical aperture, M be the magnification M, σ be the coherence factor, and P be the pitch (wafer conversion size), when condition (3) is satisfied, a pattern having a graded distribution of dose independently of the focus state can be formed on the wafer. Noting this fact, the present invention proposed to monitor the variation in exposure amount as a relative positional shift amount between the outer pattern and the inner pattern of the monitor mask after exposure using the misalignment overlay inspection equipment, FIG. 22 is a plan view showing the exposure amount monitor mark. In an exposure amount detection pattern 1500 shown in FIG. 22, a pair of relative position detection patterns 1504 (1504a and 1504b) and exposure amount monitor pattern 1501 sandwiched between the relative position detection patterns are arrayed in the X-axis direction (one direction). In addition, a pair of y-axis-direction positional shift amount detection patterns 1505 (1505a and 1505b) are formed to sandwich the exposure amount monitor pattern 1501 with the Y-axis perpendicular to the X-axis.

The exposure amount monitor pattern 1501 has an opening pattern 1502 and an exposure amount monitor portion 1503 connected to the opening pattern 1502 in the X-axis direction, in which the irradiation intensity distribution of exposure light transmitted through the pattern monotonically changes in the X-axis direction.

Figure 23:
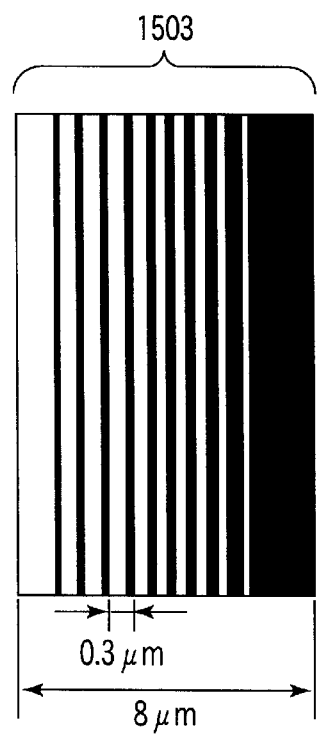
FIG. 23 is a plan view schematically showing an exposure amount monitor portion arranged in the exposure amount monitor mark shown in FIG. 22.

FIG. 23 is a schematic view of the exposure amount monitor portion 1503 arranged in the exposure amount monitor mark. For the exposure amount monitor portion 1503 shown in FIG. 23, the pitch P (on the wafer) is set to 0.3 μm equal to or smaller than the resolution limit in accordance with the exposure apparatus to be used (exposure wavelength=248 nm, NA=0.6, and σ=0.3), the duty ratio of the transparent portion to the light-shielding portion is set such that the size of the transparent portion increases in 0.625 nm increments, and such patterns are arrayed to realize a continuous distribution of image intensity independently of the focus value from 0 to 1 on the wafer surface.

Figure 24:
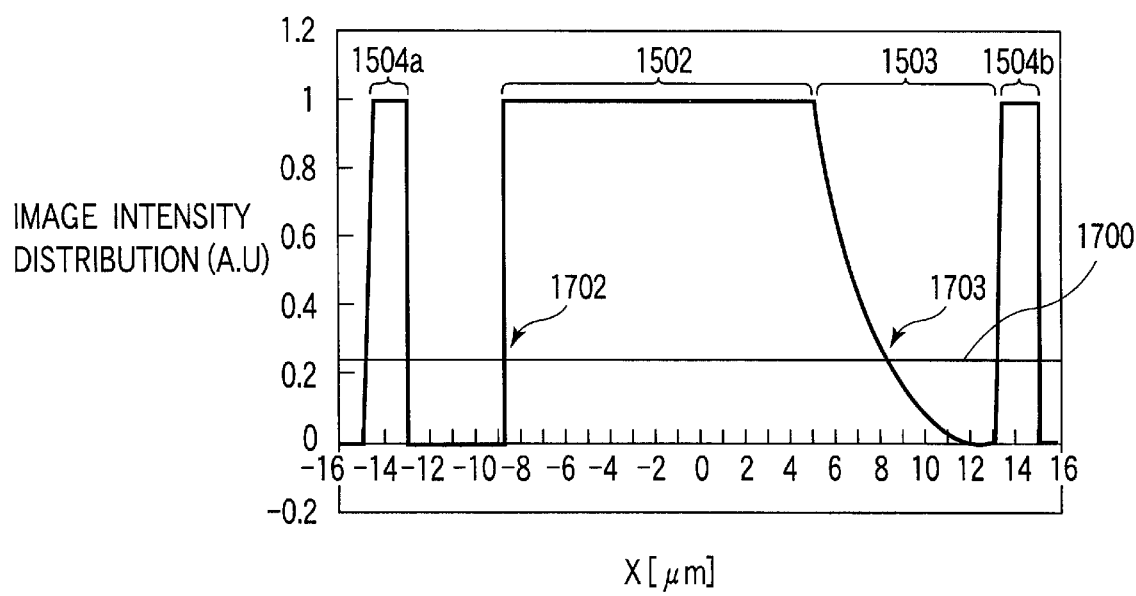
FIG. 24 is a graph showing the image intensity distribution in the section taken along a line A–A' of the exposure amount monitor mark shown in FIG. 22.
Figure 28A:
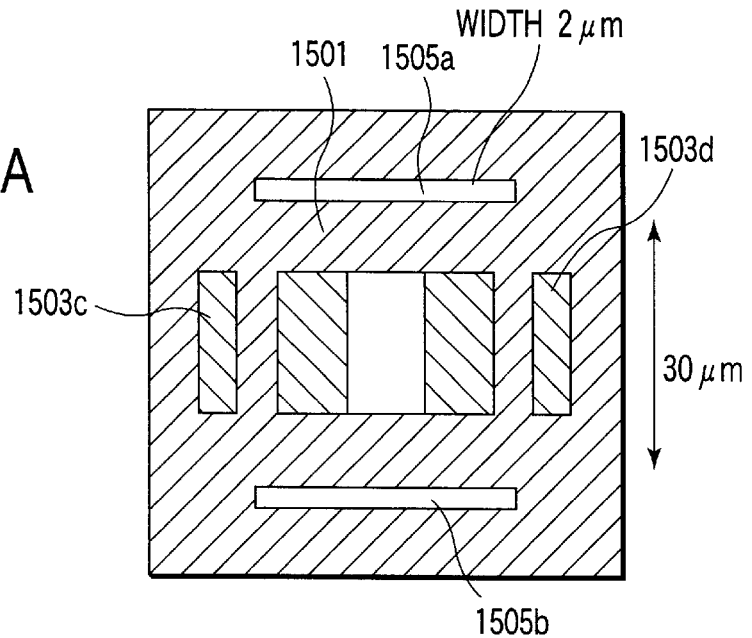
FIG. 28A is a plan view showing still another exposure amount monitor mark according to the first embodiment.
Figure 28B:
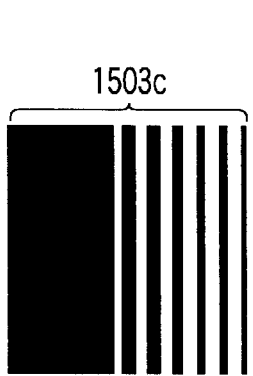
FIG. 28B is a plan view showing the structure of an exposure amount monitor portion 1503a in the exposure amount monitor mark shown in FIG. 28A.
Figure 28C:
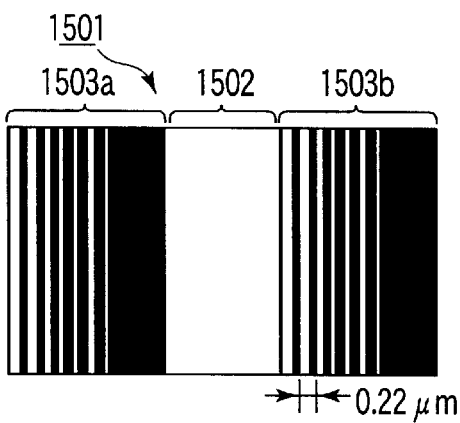
FIG. 28C is a plan view showing the structure of an exposure amount monitor pattern 1501 in the exposure amount monitor mark shown in FIG. 28A.
Figure 28D:
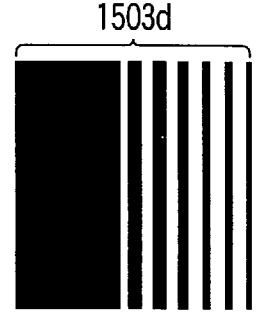
FIG. 28D is a plan view showing the structure of an exposure amount monitor portion 1503d in the exposure amount monitor mark shown in FIG. 28A.

FIG. 24 is a graph showing the light intensity distribution on the resist corresponding to a portion A–A' of the exposure amount detection pattern 1500. Referring to FIG. 24, reference numeral 1700 denotes an edge light intensity for forming an edge in the resist. Referring to FIG. 24, reference numeral 1702 denotes an intersection between the edge light intensity 1700 and exposure light transmitted through the opening pattern 1502; 1703, an intersection between the edge light intensity 1700 and the intensity of exposure light transmitted through the exposure amount monitor portion 1503; and 1504a, 1502, 1503, and 1504b, positions corresponding to the patterns 1504a, 1502, 1503, and 1504b formed on the mask, respectively.

Referring to FIG. 25, reference numeral 1801 denotes an exposure amount monitor mark formed in correspondence with the exposure amount monitor pattern; 1802 and 1803, edge formation positions corresponding to the opening pattern 1502 and exposure amount monitor portion 1503; and 1804a and 1804b, relative position detection marks formed in correspondence with the relative position detection patterns 1504.

A variation in exposure amount appears as a variation in edge light intensity 1700. Since the edge formation position 1803 corresponding to the exposure amount monitor portion 1503 varies, the corresponding edge position 1803 of the exposure amount monitor mark shifts.

As a result, a variation in appropriate exposure amount value can be detected as a relative positional shift amount Δ between a central position M' of the exposure amount monitor mark 1801 in the X-axis direction and a central position M of the relative position detection marks 1804a and 1804b by the misalignment overlay inspection equipment.

To monitor the effective exposure amount using the above exposure amount monitor mark, a relative positional shift amount with respect to a deviation from the appropriate exposure amount is obtained as a calibration curve. FIG. 26 is a graph showing a calibration curve obtained by exposing the exposure amount monitor mark shown in FIG. 22. When this calibration curve is used, the exposure amount set value of the exposure apparatus can be determined following the same procedure as described above, and the same effect as described above can be obtained.

The exposure amount monitor mark of this type is not limited to that shown in FIG. 22. Any other exposure amount monitor mark can be used as long as it has an exposure amount monitor portion for which at least part of the misalignment inspection mark is changed to a pattern that continuously changes the dose distribution on the wafer surface, and the value of an obtained misalignment amount is fed back to the set exposure amount value. It is also effective to prepare two or four exposure amount monitor portions, as shown in FIGS. 27A and 27B or FIGS. 28A to 28D to improve the detection sensitivity.

Application examples using various exposure amount monitor marks or focus monitor marks have been described above. The means for measuring the pattern after exposure is not limited to the optical microscope or optical line width measuring device, or misalignment overlay inspection equipment, and various means such as an SEM or AFM can be used. For the optical line width measuring means, various methods such as a phase shift method, differential interference method, or a measuring method using a light source with multiple wavelengths can be used. A misalignment inspection function or line width measuring function incorporated in the exposure apparatus itself may be used.

Second Embodiment

In the first embodiment, the effective exposure amount and focus value monitored after development are fed back to the exposure apparatus. In the second embodiment, an example in which the monitor result of the effective exposure amount is fed back to the baking process (post exposure baking process time (PEB time) or post exposure baking process temperature (PEB temperature)) will be described. The focus value is fed back to the focus set value of the exposure apparatus, as in the first embodiment.

Figure 29:
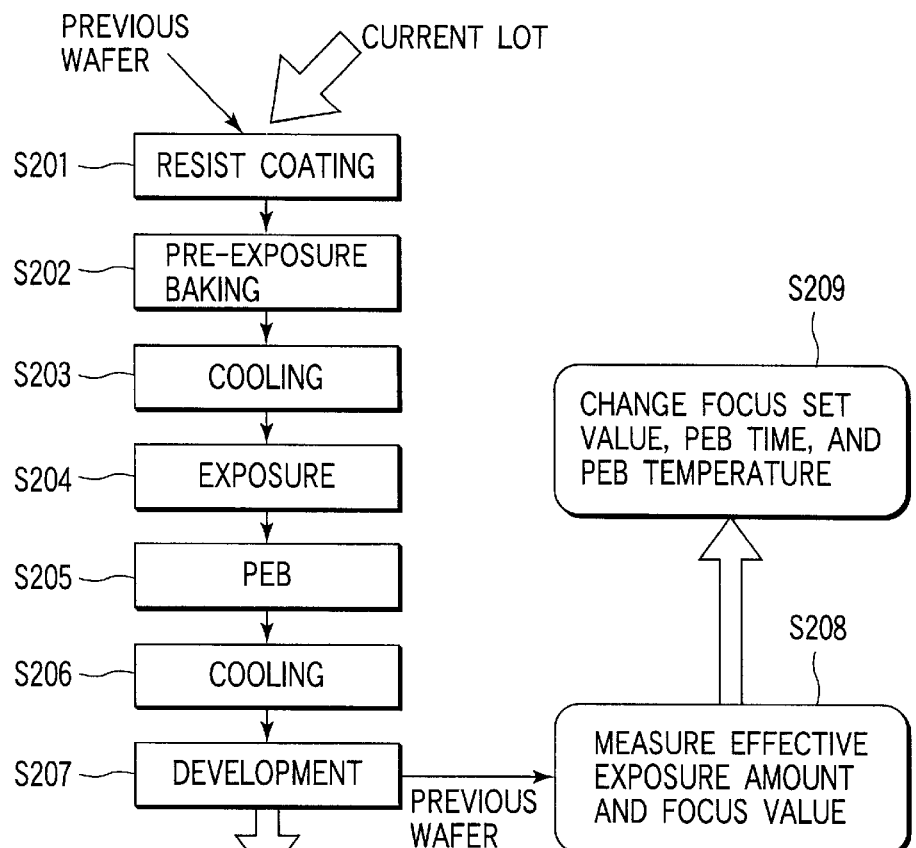
FIG. 29 is a flow chart showing the basic concept in which a method according to the second embodiment is applied to condition determination before lot supply.

FIG. 29 is a flow chart showing the basic concept in which a method according to the second embodiment is applied to condition determination before lot supply.

In this embodiment, prior to supply of the current lot, resist coating (step S201), pre-exposure baking (step S202), cooling (step S203), exposure (step S204), post exposure baking (step S205), cooling (step S206), and development (step S207) are performed for a previous wafer. Pre-exposure is done to monitor the effective exposure amount and focus value on the wafer surface, the pattern obtained by exposing the two monitor marks is evaluated, and the variation in appropriate exposure amount and the focus shift amount due to any variation in exposure process are obtained (step S208). The obtained exposure amount is fed back to the PEB time or PEB temperature and also fed back to the focus set value (step S209). The detailed method of monitoring the effective exposure amount and focus value are the same as in the first embodiment, and a detailed description thereof will be omitted.

Figure 30:
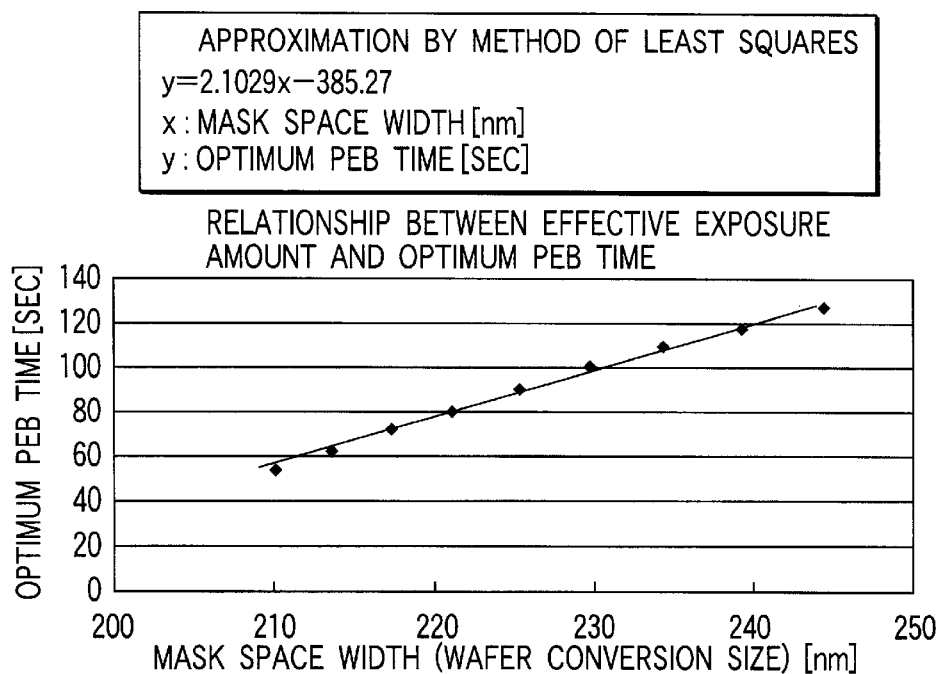
FIG. 30 is a graph showing the relationship between the effective exposure amount and the optimum PEB time in the second embodiment.

The present inventor obtained in advance an optimum PEB time and PEB temperature for the effective exposure amount obtained from the exposure amount monitor mark (FIGS. 3A, 3B, 4A, and 4B) of the first embodiment. FIG. 30 is a graph showing the relationship between the optimum PEB time and the effective exposure amount (mask space width at which the resist of the exposure amount monitor mark shown in FIG. 6 is removed).

A procedure of obtaining the PEB time and focus set value of the exposure apparatus on the basis of exposure of a previous wafer will be described next. An optimum exposure amount which satisfies both of the desired focus margin and exposure amount margin is 10.023 mJ/cm$^2$, and the effective exposure amount at that time corresponds to a space size of 225 nm at which the resist of the pattern of the exposure amount monitor mark is removed.

(Exposure Procedure 1)

In consideration of the above optimum exposure conditions, the entire previous wafer was exposed at an exposure amount set value of 10.023 mJ/cm$^2$ and focus offset of 0 µm.

(Exposure Procedure 2)

The exposure amount monitor mark and focus monitor mark were measured in at least one shot in accordance with the specifications of these marks.

More specifically, the exposure amount monitor mark (FIGS. 3A, 3B, 4A, and 4B) and focus monitor marks (FIG. 9) were measured at five points in the wafer surface. An optical microscope was used to measure the exposure amount monitor mark. The same optical line width measuring apparatus as that used to obtain the focus calibration curve was used to measure the focus monitor marks.

(Exposure Procedure 3)

In accordance with the calibration curves (FIGS. 6 and 11 in this embodiment), the effective exposure amount and focus shift amount were obtained, and the average value of five points was obtained. The effective exposure amount obtained from the exposure amount monitor mark corresponded to a monitor mark space interval of 220 nm, and the focus shift amount was 0.1 µm.

(Exposure Procedure 4)

In the current lot, exposure was performed in consideration of the average value of measured effective exposure amount and focus shift amount.

This will be described below in detail.

The exposure amount with which the maximum margin is available corresponded to a space interval of 225 nm in the exposure amount monitor mark, and the effective exposure amount increased. In accordance with the relationship between the effective exposure amount and the optimum PEB time (FIG. 30), which was obtained in advance, the PEB time was decreased from 90 sec to 77 sec. In addition, exposure was performed while adding an offset value of 0.1 µm to the focus set value of the exposure apparatus.

With this method, the variation in appropriate exposure amount and the focus shift, which are generated due to a variation in film thickness of the resist and anti-reflection film between lots or a variation in temperature in the baker, are separately monitored by measuring the exposure amount monitor mark and focus monitor marks after exposure. This enables highly accurate correction. Since the current lot is always exposed with the maximum exposure margin, the decrease in yield can be suppressed.

Figure 31:
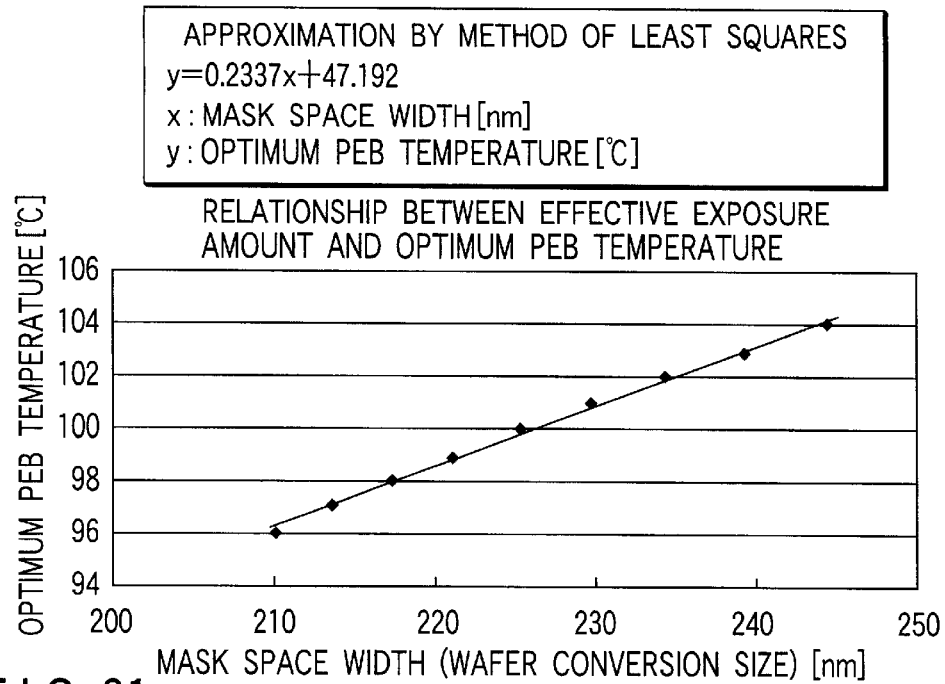
FIG. 31 is a graph showing the relationship between the effective exposure amount and the optimum PEB temperature in the second embodiment.

In this embodiment, a variation in effective exposure amount is fed back to the PEB time. However, the effective exposure amount may be fed back to the PEB temperature. In this case, the same effect as described above can be obtained by obtaining the relationship between the effective exposure amount and the optimum PEB temperature, which is shown in FIG. 31, in advance, and changing the PEB temperature from 100° C. to 98.6° C. using the obtained relationship.

The means for measuring the pattern of the monitor mark is not limited to the optical microscope or optical line width measuring device, or misalignment overlay inspection equipment, and various means such as an SEM or AFM can be used. For the optical line width measuring means, various methods such as a phase shift method, differential interference method, or a measuring method using a light source with multiple wavelengths can be used. A misalignment inspection function or line width measuring function incorporated in the exposure apparatus itself may be used.

The above method can be applied to not only the exposure amount monitor mark and focus monitor mark of this embodiment but also the marks described in the first embodiment.

Third Embodiment

In the second embodiment, the effective exposure amount and focus value, which are monitored after development, are fed back to the exposure apparatus, PEB temperature, and PEB time. In the third embodiment, an example in which the monitor result of the effective exposure amount is fed pack to the development time will be described. The focus value is fed back to the focus set value of the exposure apparatus, as in the first embodiment.

Figure 32:
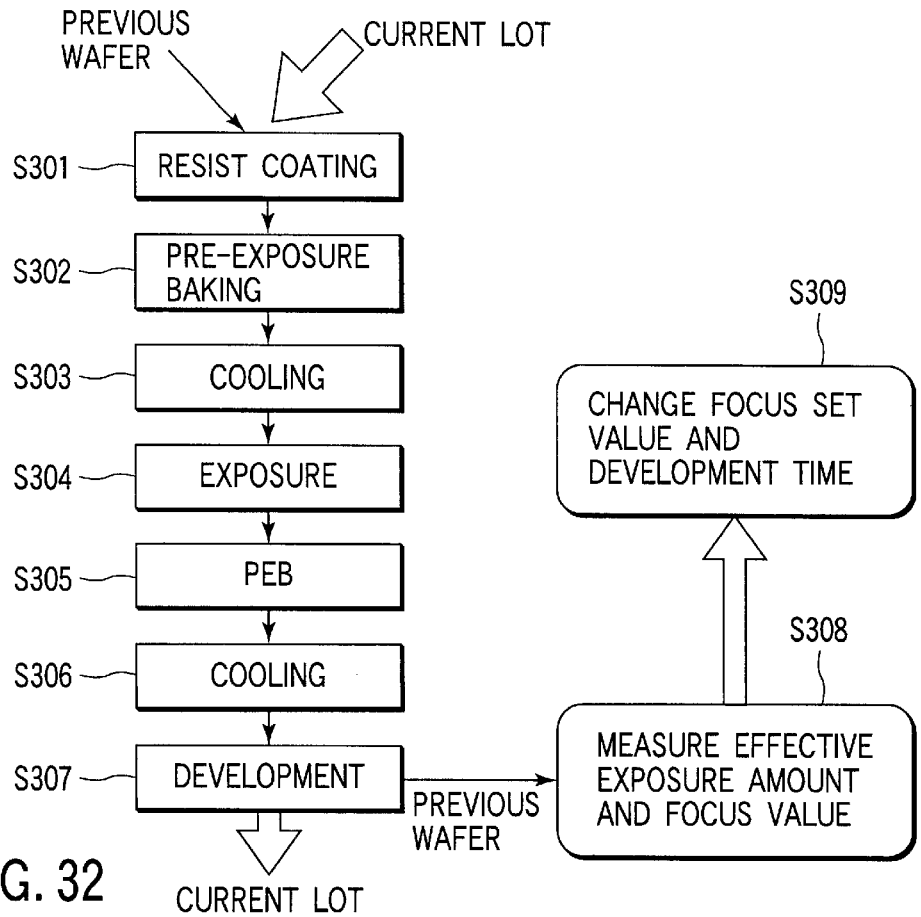
FIG. 32 is a flow chart showing the basic concept in which a method according to the third embodiment is applied to condition determination before lot supply.

FIG. 32 is a flow chart showing the basic concept in which a method according to the third embodiment is applied to condition determination before lot supply.

In this embodiment, prior to supply of the current lot, resist coating (step S301), pre-exposure baking (step S302), cooling (step S303), exposure (step S304), post exposure baking (step S305), cooling (step S306), and development (step S307) are performed for a previous wafer. Pre-exposure is done to monitor the effective exposure amount and focus value on the wafer surface, the pattern obtained by exposing the two monitor marks is evaluated, and the variation in appropriate exposure amount and the focus shift amount due to the variation in exposure process are obtained (step S308). The obtained exposure amount is fed back to the development time and also fed back to the focus set value (step S309).

The detailed method of monitoring the effective exposure amount and focus value are the same as in the first embodiment, and a detailed description thereof will be omitted.

Figure 33:
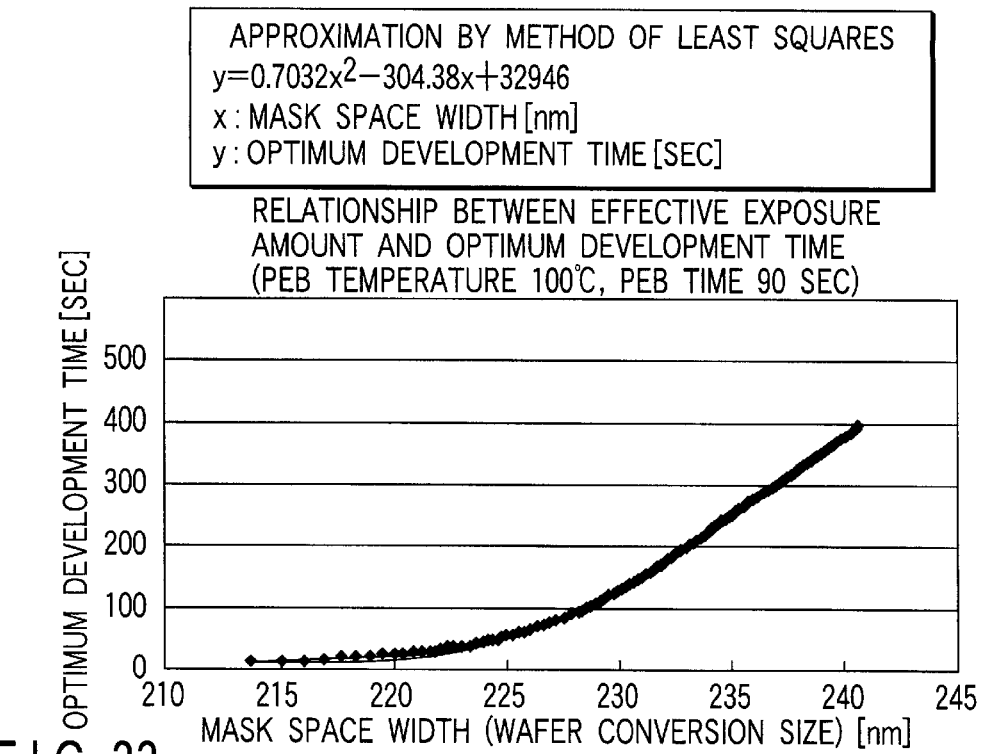
FIG. 33 is a graph showing the relationship between the effective exposure amount and the optimum development time in the third embodiment.

The present inventor obtained in advance an optimum development time for the effective exposure amount obtained from the exposure amount monitor mark (FIGS. 3A, 3B, 4A, and 4B) of the first embodiment. FIG. 33 is a graph showing the relationship between the optimum development time and the effective exposure amount (mask space width at which the resist of the exposure amount monitor mark shown in FIG. 6 is removed).

A procedure of obtaining the PEB time and focus set value of the exposure apparatus on the basis of exposure of a previous wafer will be described next. An optimum exposure amount which satisfies both of the desired focus margin and exposure amount margin is 10.023 mJ/cm$^2$, and the effective exposure amount at that time corresponds to a space size of 225 nm at which the resist of the pattern of the exposure amount monitor mark is removed.

(Exposure Procedure 1)

In consideration of the above optimum exposure conditions, the entire previous wafer was exposed at an exposure amount set value of 10.023 mJ/cm$^2$ and focus offset of 0 µm.

(Exposure Procedure 2)

The exposure amount monitor mark and focus monitor mark were measured in at least one shot in accordance with the specifications of these marks.

More specifically, the exposure amount monitor mark (FIGS. 3A, 3B, 4A, and 4B) and focus monitor marks (FIG. 9) were measured at five points in the wafer surface. An optical microscope was used to measure the exposure amount monitor mark. The same optical line width measuring apparatus as that used to obtain the focus calibration curve was used to measure the focus monitor marks.

(Exposure Procedure 3)

In accordance with the calibration curves (FIGS. 6 and 11 in this embodiment), the effective exposure amount and focus shift amount were obtained, and the average value of five points was obtained. The effective exposure amount obtained from the exposure amount monitor mark corresponded to a monitor mark space interval of 223.125 nm, and the focus shift amount was 0.1 μm.

(Exposure Procedure 4)

In the current lot, exposure was performed in consideration of the average value of measured effective exposure amount and focus shift amount.

This will be described below in detail.

The exposure amount with which the maximum margin is available corresponded to a space interval of 225 nm in the exposure amount monitor mark, and the effective exposure amount increased. In accordance with the relationship between the effective exposure amount and the optimum development time (FIG. 33), which was obtained in advance, the development time was decreased from 60 sec to 40 sec. In addition, exposure was performed while adding an offset value of 0.1 μm to the focus set value of the exposure apparatus.

With this method, the variation in appropriate exposure amount and the focus shift, which are generated due to a variation in film thickness of the resist and anti-reflection film between lots or a variation in temperature in the baker, are separately monitored by measuring the exposure amount monitor mark and focus monitor marks after exposure. This enables highly accurate correction. Since the current lot is always exposed with the maximum exposure margin, the decrease in yield can be suppressed.

The means for measuring the pattern of the monitor mark is not limited to the optical microscope or optical line width measuring device, or misalignment overlay inspection equipment, and various means such as an SEM or AFM can be used. For the optical line width measuring means, various methods such as a phase shift method, differential interference method, or a measuring method using a light source with multiple wavelengths can be used. A misalignment inspection function or line width measuring function incorporated in the exposure apparatus itself may be used.

The above method can be applied to not only the exposure amount monitor mark and focus monitor mark of this embodiment but also the marks described in the first embodiment.

Fourth Embodiment

Figure 34:
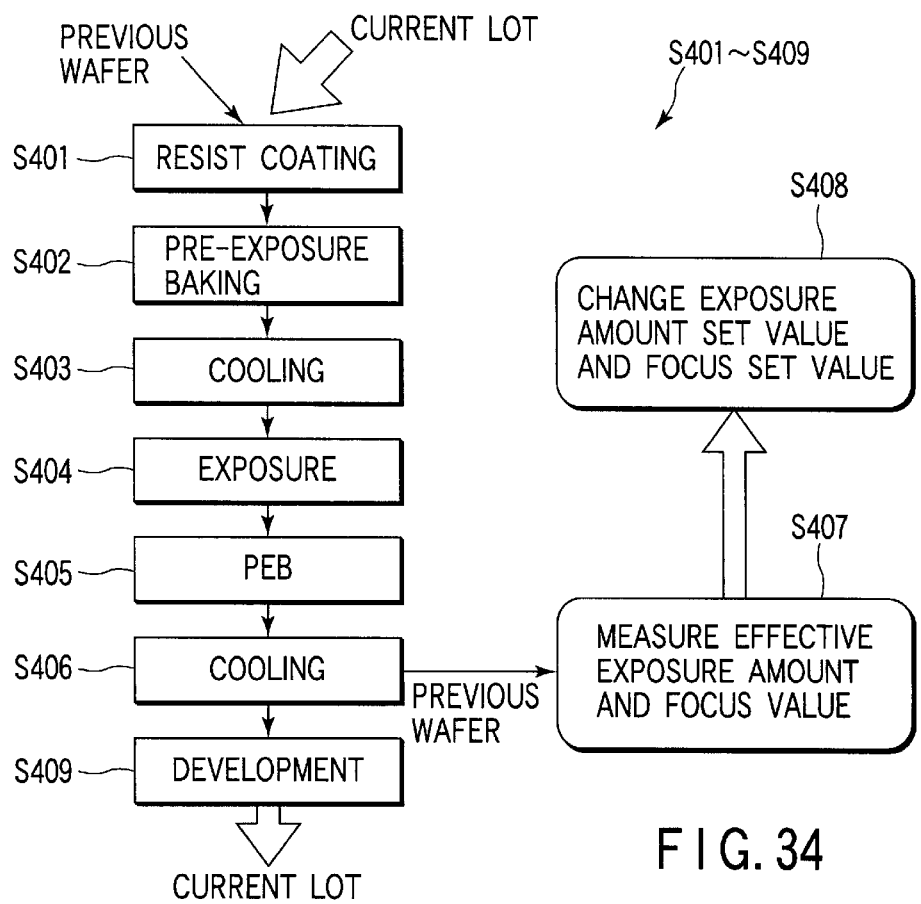
FIG. 34 is a flow chart showing the basic concept in which a method according to the fourth embodiment is applied to condition determination before lot supply.

In the fourth embodiment, an example in which an exposure amount monitor mark and focus monitor mark during or after cooling after PEB are monitored, as shown in FIG. 34, and fed back to various exposure parameters will be described.

In this embodiment, prior to supply of the current lot, resist coating (step S401), pre-exposure baking (step S402), cooling (step S403), exposure (step S404), post exposure baking (step S405), and cooling to the room temperature in a cooling unit (step S406) are performed for a previous wafer, and the effective exposure amount and focus value are measured using the exposure amount monitor mark and focus monitor mark shown in FIGS. 3A, 3B, 4A, 4B, and 9 (step S407). The obtained exposure amount and focus position are fed back to the exposure time and focus set value (step S408).

After feed back to the exposure time and focus set value, the current lot is supplied, and resist coating (step S401), pre-exposure baking (step S402), cooling (step S403), exposure (step S404), post exposure baking (step S405), cooling to the room temperature in the cooling unit (step S406), and development (step S409) are performed.

As for the focus monitor method, the same procedure of monitoring the pattern after development as in the first embodiment is performed for the latent image pattern, and a detailed description thereof will be omitted. A method of monitoring the effective exposure amount will be described below in detail.

The exposure amount is monitored by measuring a resist film thickness change amount (to be referred to as $\Delta Tr$ hereinafter) in an unexposed region and an exposed region after the PEB cooling process. As an exposure amount monitor region, letting E be the exposure amount on the projection substrate at the time of exposure, a region having a space interval with which the light amount after transmission through the exposure amount monitor mark shown in FIGS. 4A and 4B becomes $(0.3) \times E$ is used.

Figure 35:
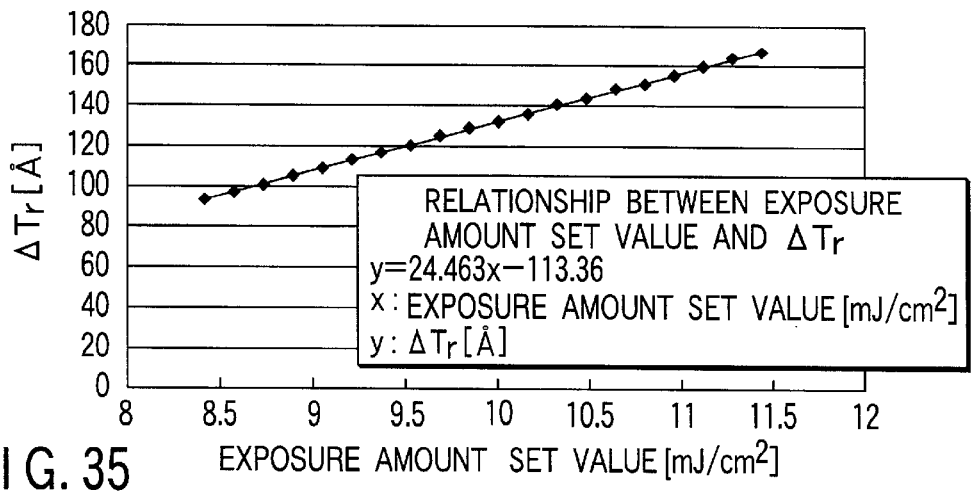
FIG. 35 is a graph showing the relationship between the exposure amount and a decrease amount ΔTr of resist film thickness after PEB cooling in the fourth embodiment.

The effective exposure amount is monitored using the decrease amount $\Delta Tr$ of the resist film thickness in the exposure amount monitor region observed in PEB cooling. First, in the exposure amount monitor region, the exposure amount set value of the exposure apparatus is changed, exposure is performed, and the decrease amount $\Delta Tr$ of the resist film thickness after PEB cooling is measured using an optical film thickness meter. FIG. 35 is a graph showing the relationship between the exposure amount and the decrease amount $\Delta Tr$ of the resist film thickness after PEB cooling. Since the exposure light transmitted through the exposure amount monitor mark exhibits flat exposure independently of the defocus value, the effective exposure amount is reflected on the decrease amount $\Delta Tr$ of the resist film thickness after PEB cooling, which is formed by this exposure light. Hence, the result shown in FIG. 35 was used as a calibration curve for monitoring the effective exposure amount.

A procedure of obtaining the exposure amount and focus set value of the exposure apparatus on the basis of exposure of a previous wafer will be described next. An optimum exposure amount which satisfies both of the desired focus margin and exposure amount margin is 10.023 mJ/cm$^2$, and as the effective exposure amount at that time, the decrease amount $\Delta Tr$ of the resist film thickness after PEB cooling is 132 Å.

(Exposure Procedure 1)

In consideration of the above optimum exposure conditions, the entire previous wafer was exposed at an exposure amount set value of 10.023 mJ/cm$^2$ and focus offset of 0 μm.

(Exposure Procedure 2)

The exposure amount monitor mark and focus monitor mark were measured in at least one shot in accordance with the specifications of these marks.

More specifically, the exposure amount monitor mark (FIGS. 3A, 3B, 4A, and 4B) and focus monitor marks (FIG.

9) were measured at five points in the wafer surface. An optical film thickness meter was used to measure the exposure amount monitor mark. The same optical line width measuring apparatus as that used to obtain the focus calibration curve was used to measure the focus monitor marks.

(Exposure Procedure 3)

In accordance with the calibration curves (FIG. 35 in this embodiment), the effective exposure amount and focus shift amount were obtained.

When the average value of five points was obtained, as the effective exposure amount obtained from the exposure amount monitor mark, the decrease amount $\Delta Tr$ of the resist film thickness was 117.6 Å. The focus shift amount was 0.1 μm.

(Exposure Procedure 4)

In the current lot, exposure was performed in consideration of the average value of measured effective exposure amount and focus shift amount.

This will be described below in detail.

The exposure amount with which the maximum margin is available is obtained when the decrease amount $\Delta Tr$ of the resist film thickness was 132 Å, and the effective exposure amount decreased. In accordance with the relationship between the effective exposure amount and the set exposure amount (FIG. 35), which was obtained in advance, even when exposure at 10.023 mJ/cm$^2$ was expected, the exposure amount actually decreased to 9.44 mJ/cm$^2$ (5.6%). An exposure amount corresponding to the decrease amount was fed back to the exposure amount set value of the exposure apparatus. In addition, exposure was performed while adding an offset value of 0.1 μm to the focus set value of the exposure apparatus.

With this method, the variation in appropriate exposure amount and the focus shift, which are generated due to a variation in film thickness of the resist and anti-reflection film between lots or a variation in temperature in the baker, are separately monitored by measuring the exposure amount monitor mark and focus monitor marks after exposure. This enables highly accurate correction. Since the current lot is always exposed with the maximum exposure margin, the decrease in yield can be suppressed.

In this embodiment, a variation in appropriate exposure amount value is fed back to the exposure amount set value of the exposure apparatus. However, even when it is fed back to the PEB time, PEB temperature, or development time, the same effect as described above can be obtained. In this case, a calibration curve is obtained in advance by replacing the effective exposure amount in the graph shown in FIGS. 30, 31, or 33 with the decrease amount $\Delta Tr$ of the resist film thickness, and the variation in appropriate exposure amount is fed back using this calibration curve.

Even when the PEB process is not executed depending on the resist material used, a change in resist film thickness (including a change in refractive index or transmittance) after exposure can be sometimes observed. In this case as well, a variation in effective exposure amount and focus shift amount can be monitored according to the same procedures as described above using the patterns of the exposure amount monitor mark and focus monitor mark after exposure. In this case as well, when the exposure amount and focus value are controlled according to the same procedures as described above, the current lot is always exposed with the maximum exposure margin, and the decrease in yield can be suppressed.

In addition, the development device is equipped with a function of observing the transferred patterns of the exposure amount monitor mark and focus monitor mark, the mark of predetermined space interval in the exposure amount monitor mark portion is observed during development, and the effective exposure amount is calibrated on the basis of the time from the start of development until the mark is completely dissolved, the effective exposure amount and focus shift amount can be monitored and fed back to various exposure conditions.

The means for measuring the pattern of the monitor mark is not limited to the optical microscope or optical line width measuring device, or misalignment overlay inspection equipment, and various means such as an SEM or AFM can be used. For the optical line width measuring means, various methods such as a phase shift method, differential interference method, or a measuring method using a light source with multiple wavelengths can be used. A misalignment inspection function or line width measuring function incorporated in the exposure apparatus itself may be used.

The above method can be applied to not only the exposure amount monitor mark and focus monitor mark of this embodiment but also the marks described in the first embodiment.

Fifth Embodiment

In the fifth embodiment, an example in which a method according to this embodiment is applied to a continuous lot process will be described.

During the continuous lot process, the effective exposure amount and focus shift amount are monitored for one or more wafers in the lot and fed back to the exposure parameters for the next lot when a shift occurs.

The exposure amount monitor mark and focus monitor mark are arranged in a mask region where no device pattern was arranged.

First, under the resist process conditions to be used, a focus calibration curve and calibration curve for the effective exposure amount are obtained in advance. As a result, the same calibration curves as in the first embodiment (FIGS. 6 and 11) are obtained. In this exposure process, using an exposure amount monitor mark and focus monitor mark having the characteristics of these calibration curves, the effective exposure amount and focus shift amount are obtained, and the exposure parameters are controlled.

Figure 36:
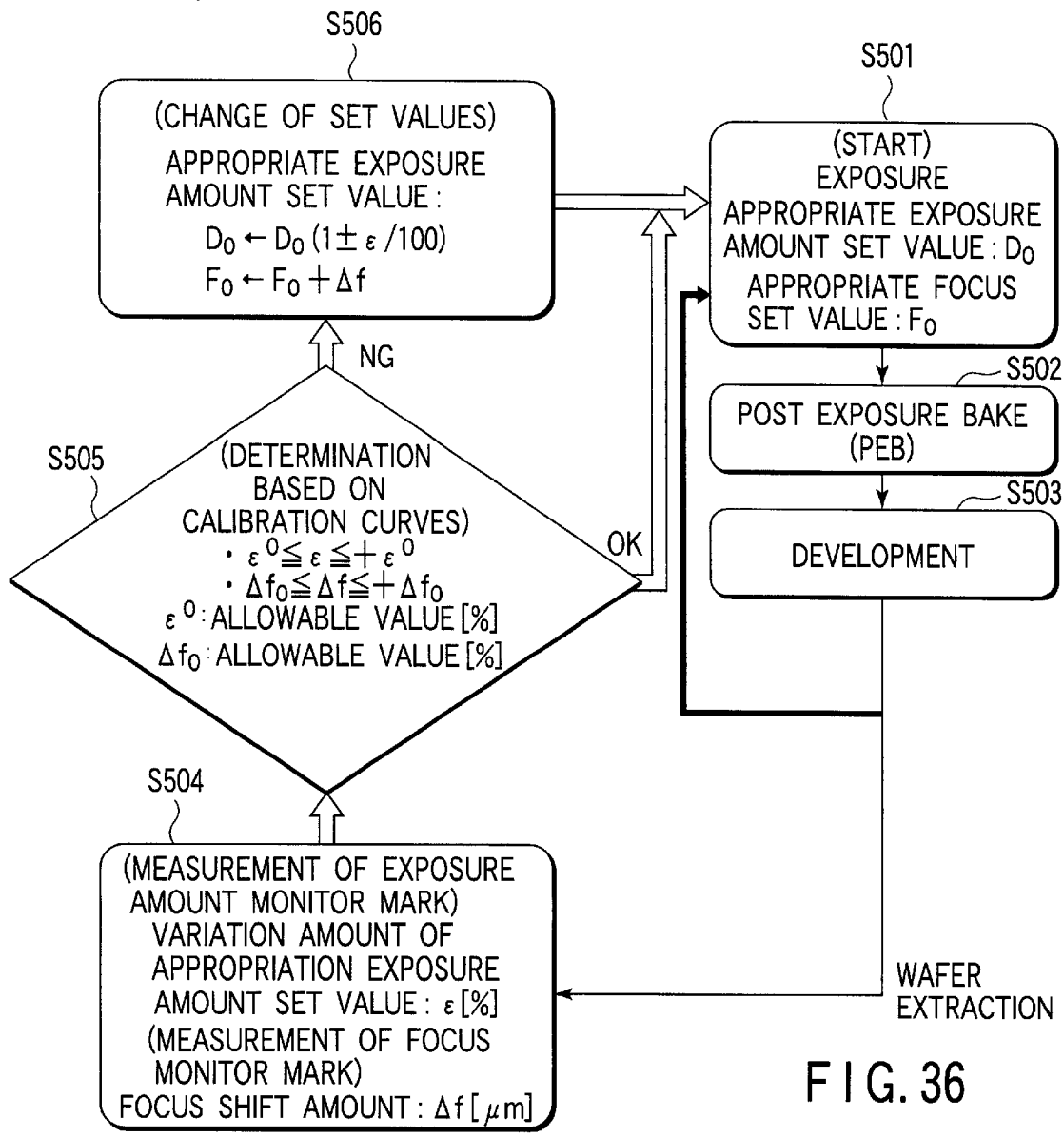
FIG. 36 is a flow chart showing the procedure of controlling the exposure amount and focus value in the fifth embodiment.

FIG. 36 is a flow chart showing the procedure of controlling the exposure amount and focus value. First, an appropriate exposure amount set value $D_o$ and appropriate focus set value $F_o$ are set (step S501). Supply of lots is started, and PEB (step S502) and development (step S503) are performed for each lot.

One or more wafers after development are extracted, the exposure amount monitor mark and focus monitor mark arranged in the wafer surface are measured in at least one shot, and a variation amount $\epsilon E_i$ (i is the shot number) of the effective appropriate exposure amount value and a focus shift amount $\Delta f_i$ (i is the shot number) are obtained from the calibration curves (step S504). From the variation amount $\epsilon_i$ of the appropriate exposure amount value of the measured shot, $\epsilon=\Sigma\epsilon_i/n$ is obtained as a variation amount of the appropriate exposure amount value in the wafer surface, and $\Delta f=\Sigma\Delta f_i/n$ is obtained as the focus shift amount, and it is determined whether these values are smaller than allowable values (step S505).

If the variation amount $\epsilon$ of the appropriate exposure amount value and the focus shift amount $\Delta f$ fall within the ranges of predetermined allowable values $\epsilon_0$ and $\Delta f_0$, the lot is directly supplied. If the variation amount $\epsilon$ of the appropriate exposure amount value and the focus shift amount $\Delta f$ fall outside the ranges of allowable values $\epsilon_0$ and $\Delta f_0$, the exposure amount and focus set value of the exposure apparatus are changed by only the variation amounts $\epsilon$ and $\Delta f$, and these values are fed back to the next lot (step S506).

With this method, the variation in appropriate exposure amount and the focus shift, which are generated due to a variation in film thickness of the resist and anti-reflection film between lots or a variation in temperature in the baker, are separately monitored by measuring the exposure amount monitor mark and focus monitor marks after exposure. This enables highly accurate correction. Since the current lot is always exposed with the maximum exposure margin, the decrease in yield can be suppressed.

In this embodiment, a variation in appropriate exposure amount value is fed back to the set exposure amount of the exposure apparatus. However, even when it is fed back to the PEB time, PEB temperature, or development time, the same effect as described above can be obtained. In this case, feed back is done using a calibration curve shown in FIGS. 30, 31, or 33. Additionally, in this embodiment, the effective exposure amount and focus shift amount on the basis of the patterns of the exposure amount monitor mark and focus monitor mark after development are monitored. However, as described in the fourth embodiment, the effective exposure amount and focus shift amount may be obtained by measuring the patterns after exposure or PEB cooling, or during development.

In the above-described control, a lot unit is assumed, and the exposure amount and focus shift amount are fed back to the exposure parameters. This control can also be applied to correction in units of wafers.

In addition, when the speed of measurement of the variation amount of the appropriate exposure amount is increased, and for example, the marks are monitored after exposure, the variation amount can also be corrected for the monitored wafer itself in the PEB time in the subsequent PEB process.

The means for measuring the pattern of the monitor mark is not limited to the optical microscope or optical line width measuring device, or misalignment overlay inspection equipment, and various means such as an SEM or AFM can be used. For the optical line width measuring means, various methods such as a phase shift method, differential interference method, or a measuring method using a light source with multiple wavelengths can be used. A misalignment inspection function or line width measuring function incorporated in the exposure apparatus itself may be used.

The above method can be applied to not only the exposure amount monitor mark and focus monitor mark of this embodiment but also the marks described in the first embodiment.

Sixth Embodiment

In the sixth embodiment, an example in which a method according to this embodiment is applied to a continuous lot process will be described.

During the continuous lot process, the effective exposure amount and focus shift amount are monitored for one or more wafers in each of n lots previously processed, and fed back to the exposure parameters in accordance with a shift amount generated in each lot.

The exposure amount monitor mark and focus monitor mark are arranged in a mask region where no device pattern is arranged. First, under the resist process conditions to be used, a focus calibration curve and calibration curve for the effective exposure amount (FIGS. 6 and 11) are obtained in advance. In this exposure process, using an exposure amount monitor mark and focus monitor mark having the characteristics of these calibration curves, the effective exposure amount and focus shift amount are obtained, and the exposure parameters are controlled.

FIG. 37 is a flow chart showing the procedure of controlling the exposure amount and focus value. First, an appropriate exposure amount set value $D_o$ and appropriate focus set value $F_o$ are set (step S601). Supply of lots is started, and PEB (step S602) and development (step S603) are performed for each lot.

One or several wafers after development are extracted. The exposure amount monitor mark and focus monitor mark are measured at multiple points and measured values are averaged. A variation amount $\epsilon_{n-1}$ of the effective appropriate line width value and a focus shift amount $\Delta f_{n-1}$ in, e.g., the (n−1)th lot are obtained from the calibration curves (step S604). In this case, to feed back the history data of previous lots as an accumulated average, for example, a known technique (Jpn. Pat. Appln. KOKAI Publication No. 8-45804) is used. Correction values for the nth lot, which are given by $$\varepsilon_n = \frac{1}{n-1}\sum_{i=1}^{n-1}(\varepsilon_i \pm \delta_\varepsilon) \tag{4}$$

$$\Delta f_n = \frac{1}{n-1}\sum_{i=1}^{n-1}(\Delta f_i \pm \delta_{\Delta f}) \tag{5}$$

(where $\delta_\epsilon$ is a correction factor derived from the process execution result and target value) are obtained from the variation amounts of appropriate exposure amount values and focus shift amounts of the previous first to (n−1)th lots (step S605). The exposure amount and focus value of the exposure apparatus are corrected in accordance with the obtained correction values and fed back to the next lot (step S606).

With this method, the variation in appropriate exposure amount and the focus shift, which are generated due to a variation in film thickness of the resist and anti-reflection film between lots or a variation in temperature in the baker, are separately monitored by measuring the exposure amount monitor mark and focus monitor marks after exposure. This enables highly accurate correction. Since the current lot is always exposed with the maximum exposure margin, the decrease in yield can be suppressed.

The correction methods are not limited to (4) and (5), and various changes and modifications can be made in accordance with the product type or situations. In the correction methods (4) and (5), the shift amounts from the first lot to the immediately preceding lot are uniformly averaged. However, the first lot need not always be taken into consideration, and uniform average processing is not always necessary. For example, shift amounts in the immediately preceding lot (first but the last), and the second and third lots but the last can be effectively weighted by, e.g., 0.5, 0.3, and 0.2, respectively, and averaged.

In this embodiment, a variation in appropriate exposure amount value is fed back to the set exposure amount of the exposure apparatus. However, even when it is fed back to the PEB time, PEB temperature, or development time, the same effect as described above can be obtained. In this case, feed back is done using a calibration curve shown in FIGS. 30, 31, or 33. Additionally, in this embodiment, the effective exposure amount and focus shift amount on the basis of the patterns of the exposure amount monitor mark and focus monitor mark after development are monitored. However, as described in the fourth embodiment, the effective exposure amount and focus shift amount may be obtained by measuring the patterns after exposure or PEB cooling, or during development.

In the above-described control, a lot unit is assumed, and the exposure amount and focus shift amount are fed back to the exposure parameters. This control can also be applied to correction in units of wafers.

In addition, when the speed of measurement of the variation amount of the appropriate exposure amount is increased, and for example, the marks are monitored after exposure, the variation amount can also be corrected for the monitored wafer itself in the PEB time in the subsequent PEB process.

The means for measuring the pattern of the monitor mark is not limited to the optical microscope or optical line width measuring device, or misalignment overlay inspection equipment, and various means such as an SEM or AFM can be used. For the optical line width measuring means, various methods such as a phase shift method, differential interference method, or a measuring method using a light source with multiple wavelengths can be used. A misalignment inspection function or line width measuring function incorporated in the exposure apparatus itself may be used.

The above method can be applied to not only the exposure amount monitor mark and focus monitor mark of this embodiment but also the marks described in the first embodiment.

Seventh Embodiment

As the seventh embodiment, an example in which the effective exposure amount and focus value in each shot in a wafer surface is monitored, and exposure parameters for exposure of the subsequent wafers at the same shot position are controlled will be described.

In this case, to monitor the effective exposure amount, the exposure amount is controlled using the exposure amount monitor mark shown in FIG. 22 in the first embodiment, which can be accurately detected at a high speed by a misalignment overlay inspection equipment.

The exposure amount monitor mark shown in FIG. 22 is arranged in a mask region where no device pattern is arranged. First, under the resist process conditions to be used, exposure is performed while changing the exposure amount from the exposure amount set value with which the maximum margin was obtained, thereby generating the relationship (calibration curve shown in FIG. 26) between the relative positional shift amount and the variation in appropriate exposure amount. The focus monitor mark shown in FIG. 9 in the first embodiment is used, and control is done using a resultant calibration curve (FIG. 11).

Figure 38:
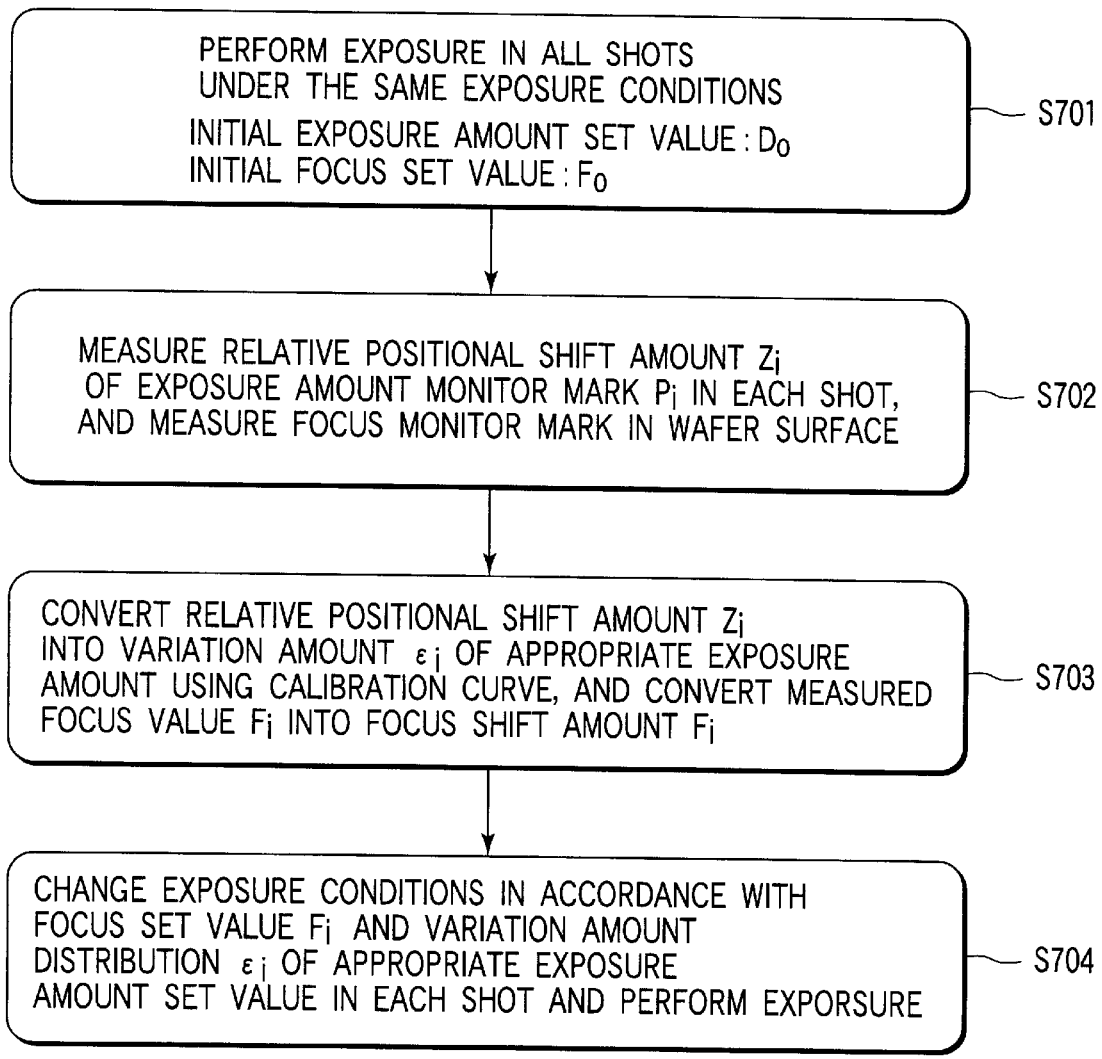
FIG. 38 is a flow chart showing the procedure of controlling the exposure amount and focus value in the seventh embodiment.

FIG. 38 is a flow chart showing the procedure of controlling the exposure amount and focus value. First, exposure is performed in all shots under the same conditions using an initial exposure amount set value $D_o$ and initial focus set value $F_o$ (step S701).

Next, for a wafer after development, a relative positional shift amount $Z_i$ in the X-axis direction in the exposure amount monitor mark arranged for each shot is measured using a misalignment overlay inspection equipment. A pattern length W of the pattern obtained by exposing the focus monitor mark is measured using an optical measuring device (step S702).

A variation amount $\epsilon_i$ of the appropriate exposure amount and a focus shift amount $F_i$ are obtained from the relative positional shift amount $Z_i$ and measured focus value $f_i$ using the calibration curves shown in FIGS. 26 and 11 (step S703).

On the basis of these results, the variation amount of the appropriate exposure amount and the focus shift amount are fed back in units of shots of a subsequent wafer, and exposure is performed (step S704).

In this case, the variation amount and focus shift amount are fed back to the focus set value in each shot. However, the tendency of the focus shift amount in the wafer surface may be monitored and fed back to the leveling adjustment value of the exposure apparatus.

To implement such exposure procedure, the present inventor prepared a monitor means for monitoring a variation in effective exposure amount and the focus shift amount, an arithmetic means for calculating, from the monitor results, the variation amount of exposure amount and the focus shift amount on the basis of calibration curves, and a data input means for inputting the exposure amount set value and focus set value to the exposure apparatus in consideration of desired offset amounts in each shot, which are obtained by the arithmetic means so as to enable exposure.

With this method, the variation in appropriate exposure amount and the focus shift, which are generated due to unevenness of film thickness of the resist and anti-reflection film in the wafer surface or unevenness of temperature in the baker, are separately monitored by measuring the exposure amount monitor mark and focus monitor marks after exposure. This enables highly accurate correction. Since the current lot is always exposed with the uniform and maximum exposure margin in the wafer surface, the decrease in yield can be suppressed.

In this embodiment, a variation in appropriate exposure amount value is fed back to the set exposure amount of the exposure apparatus. However, even when it is fed back to the PEB time, PEB temperature, or development time, the same effect as described above can be obtained. In this case, feed back is done using a calibration curve shown in FIGS. 30, 31, or 33.

Additionally, in this embodiment, the effective exposure amount and focus shift amount on the basis of the patterns of the exposure amount monitor mark and focus monitor mark after development are monitored. However, as described in the fourth embodiment, the effective exposure amount and focus shift amount may be obtained by measuring the patterns after exposure or PEB cooling, or during development. In addition, when the speed of measurement of the variation amount of the appropriate exposure amount is increased, and for example, the marks are monitored after exposure, the variation amount can also be corrected for the monitored wafer itself in the PEB time in the subsequent PEB process.

The means for measuring the pattern of the monitor mark is not limited to the optical microscope or optical line width measuring device, or misalignment overlay inspection equipment, and various means such as an SEM or AFM can be used. For the optical line width measuring means, various methods such as a phase shift method, differential interference method, or a measuring method using a light source with multiple wavelengths can be used. A misalignment inspection function or line width measuring function incorporated in the exposure apparatus itself may be used.

The above method can be applied to not only the exposure amount monitor mark and focus monitor mark of this embodiment but also the marks described in the first embodiment.

The present invention is not limited to the above embodiments, and various changes and modifications can be made without departing from the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A control method for an exposure apparatus, in which an exposure amount and a focus value are set in transferring a circuit pattern on a mask onto a resist formed on a wafer by the exposure apparatus, comprising the steps of:

arranging, on the mask, an exposure amount monitor mark and a focus monitor mark used to separately monitor an effective exposure amount and a focus value on the wafer;

transferring the exposure amount monitor mark and the focus monitor mark onto the resist to form an exposure amount monitor pattern and a focus monitor pattern;

measuring states of the exposure amount monitor pattern and the focus monitor pattern at least at one of timings after exposure, after post exposure baking, during a cooling process after baking, during a process after cooling, during development, and after development;

on the basis of measurement results, calculating a difference between an optimum exposure amount value and an exposure amount set value set in the exposure apparatus and a difference between an optimum focus value and a focus set value set in the exposure apparatus in transferring the exposure amount monitor mark and the focus monitor mark onto the resist; and changing the focus set value and the exposure amount set value of the exposure apparatus in accordance with the calculated differences.

2. A method according to claim 1, further comprising measuring shapes of the exposure amount monitor pattern and the focus monitor pattern for changes in both of the effective exposure amount and focus shift amount on the resist, which are obtained in advance using the exposure amount monitor mark, and on the basis of measurement results, calculating the difference between the optimum focus value and the focus set value set in the exposure apparatus in accordance with the shapes of the exposure amount monitor pattern and the focus monitor pattern.

3. A control method for a semiconductor manufacturing apparatus, in which a parameter for photolithography including an exposure process, baking process, cooling process, and development process for transferring a circuit pattern on a mask onto a resist formed on a wafer by an exposure apparatus, comprising the steps of:

arranging, on the mask, an exposure amount monitor mark and a focus monitor mark used to separately monitor an effective exposure amount and a focus value on the wafer;

transferring the exposure amount monitor mark and the focus monitor mark onto the resist to form an exposure amount monitor pattern and a focus monitor pattern;

measuring states of the exposure amount monitor pattern and the focus monitor pattern at least at one of timings after the exposure process, after the baking process, during or after the cooling process and during or after the development process;

on the basis of measurement results, calculating a difference between an optimum exposure amount value and an exposure amount set value set in the exposure apparatus and a difference between an optimum focus value and a focus set value set in the exposure apparatus in transferring the exposure amount monitor mark and the focus monitor mark onto the resist; and changing at least one of the focus set value of the exposure apparatus, the exposure amount set value of the exposure apparatus, a baking process time in the baking process, a baking process temperature in the baking process, and a development time in the development process in accordance with the calculated differences.

4. A method according to claim 3, further comprising measuring shapes of the exposure amount monitor pattern and the focus monitor pattern for changes in both of the effective exposure amount and focus shift amount on the resist, which are obtained in advance using the exposure amount monitor mark, and on the basis of measurement results, calculating the difference between the optimum focus value and the focus set value set in the exposure apparatus in accordance with the shapes of the exposure amount monitor pattern and the focus monitor pattern.

* * * * *